(12) United States Patent
Sze et al.

(10) Patent No.: US 11,901,393 B2
(45) Date of Patent: Feb. 13, 2024

(54) IMAGE SENSOR AND MANUFACTURING METHOD THEREOF

(71) Applicant: TAIWAN SEMICONDUCTOR MANUFACTURING COMPANY LTD., Hsinchu (TW)

(72) Inventors: Jhy-Jyi Sze, Hsin-Chu (TW); Sin-Yi Jiang, Hsinchu (TW); Yi-Shin Chu, Hsinchu (TW); Yin-Kai Liao, Taipei (TW); Hsiang-Lin Chen, Hsinchu (TW); Kuan-Chieh Huang, Hsinchu (TW); Jung-I Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 262 days.

(21) Appl. No.: 17/184,965

(22) Filed: Feb. 25, 2021

(65) Prior Publication Data
US 2022/0271080 A1 Aug. 25, 2022

(51) Int. Cl.
*H01L 27/146* (2006.01)
*G01S 7/481* (2006.01)

(52) U.S. Cl.
CPC .... *H01L 27/14649* (2013.01); *H01L 27/1463* (2013.01); *H01L 27/14623* (2013.01); *H01L 27/14625* (2013.01); *H01L 27/14636* (2013.01); *H01L 27/14689* (2013.01); *H01L 27/14698* (2013.01); *G01S 7/4816* (2013.01)

(58) Field of Classification Search
CPC ......... H01L 27/14649; H01L 27/14603; H01L 27/1463; H01L 27/14636; H01L 27/1464; H01L 27/14685; H01L 27/14627; H01L 27/14609; H01L 27/14683; H01L 27/14607; H01L 27/14632; H01L 27/14687
See application file for complete search history.

(56) References Cited

U.S. PATENT DOCUMENTS

2018/0233521 A1* 8/2018 Na .................. G01S 7/4914

\* cited by examiner

*Primary Examiner* — Mounir S Amer
*Assistant Examiner* — Alexander Belousov
(74) *Attorney, Agent, or Firm* — WPAT LAW; Anthony King

(57) ABSTRACT

The present disclosure provides a semiconductor structure, including a substrate including a first material, wherein the first material generates electrical signals from radiation within a first range of wavelengths, an image sensor element including a second material, wherein the second material generates electrical signals from radiation within a second range of wavelengths, the second range is different from first range, a transparent layer proximal to a light receiving surface of the image sensor element, wherein the transparent layer is transparent to radiation within the second range of wavelength, and an interconnect structure connected to a signal transmitting surface of the image sensor element.

20 Claims, 37 Drawing Sheets

IMAGE SENSOR AND MANUFACTURING METHOD THEREOF

BACKGROUND

Semiconductor image sensors are widely used in various applications such as digital still camera (DSC), mobile phone camera, digital video (DV), digital video recorder (DVR), optical sensor (such as proximity sensor, ambient light sensor heart rate sensor), and optical sensing element (optical transceiver) applications, Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices.

Avalanche photodiodes (APD) are devices that may be compatible with traditional CMOS devices. An avalanche process can be triggered when a reverse biased p-n junction receives additional carriers, such as carriers generated by incident radiation. For example, in order to detect radiations with low intensities, the p-n junction is biased above its breakdown voltage, thereby allowing a single photon-generated carrier to trigger an avalanche current that can be detected. Image sensor operated in this mode is known as a single photon avalanche diode (SPAD) image sensor, or a Geiger-mode avalanche photodiodes or G-APD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
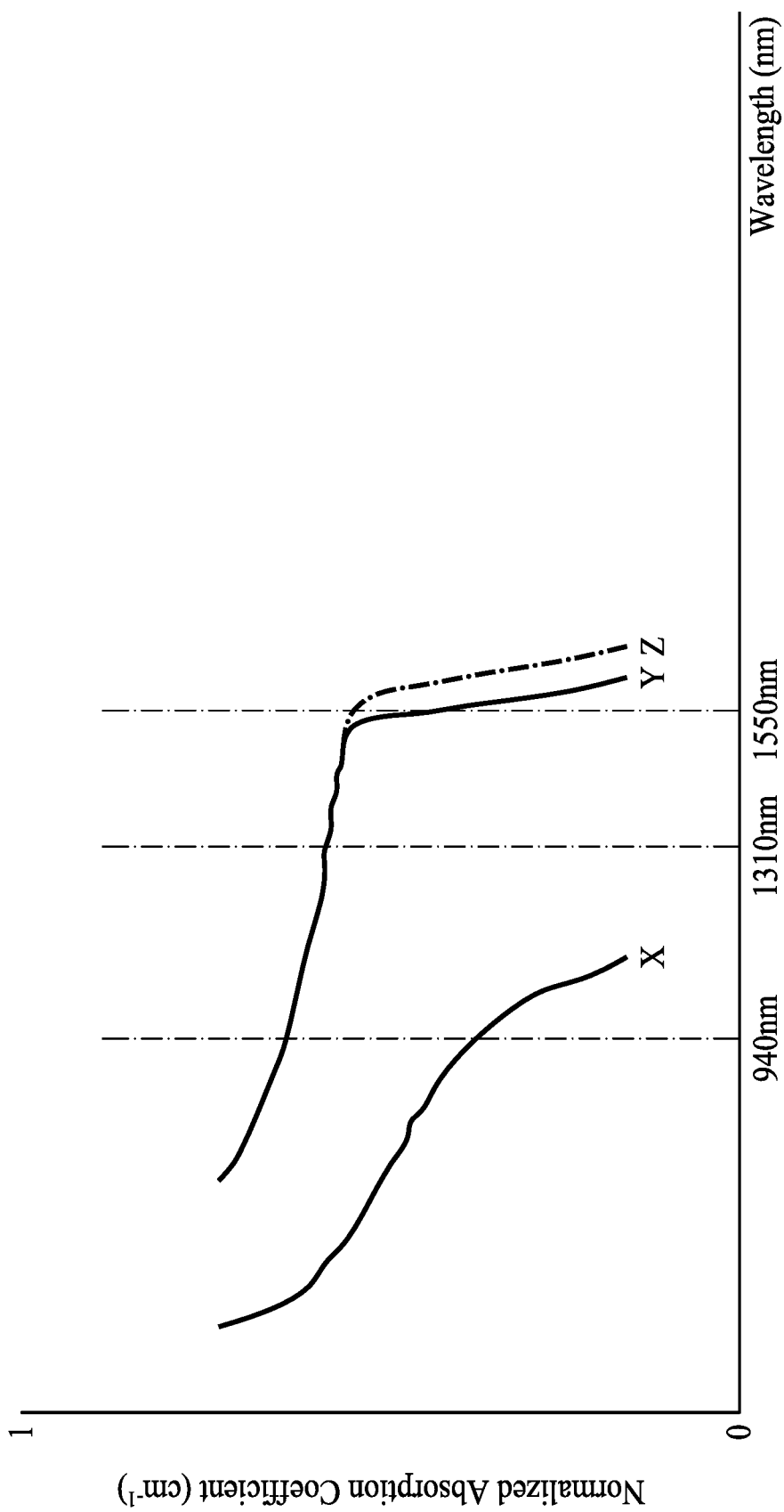
FIG. 1 is a diagram showing a comparison of materials with regard to a relationship between normalized absorption coefficient and wavelength of various materials.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Optical sensors can be utilized for detection, for example, to achieve direct time of flight (d-ToF) measurement. Single photon avalanche diode (SPAD) is a type of sensor that can detect incident radiation with very low intensities (e.g., a single photon) and convert into electrical signal. D-ToF measurement has been used in face identification, where radiation is emitted from a mobile device to user's face and optical signal being received by the mobile device by virtue of reflection take places on various portion of user's face.

However, from ophthalmology perspective, some radiations or light, within certain range of wavelength may be harmful to human's eye. In this connection, mobile devices are often required to be suitable for operation at Near-Infra-Red (NIR) eye-safe wavelengths, such as around 1.55 µm, or in some cases, around 1.5 µm or at least greater than 1.4 µm.

Referring to FIG. 1, FIG. 1 is a diagram showing a comparison of materials with regard to a relationship between normalized absorption coefficient and wavelength of various materials. Line X in FIG. 1 shows a normalized absorption coefficient and corresponding wavelength of silicon, and Line Y in FIG. 1 shows a normalized absorption coefficient and corresponding wavelength of germanium. The absorption coefficient correlates to responsivity of the corresponding material under radiations with various wavelengths, which can be used as a basis for evaluating whether one or more materials is efficient to be implemented in an optoelectronic application within certain wavelength range.

As shown in Line X, it could be observed that the absorption coefficient of silicon is lower than desired at NIR wavelengths (around 1550 nm). Accordingly, it could be determined that the function of silicon-based SPAD is limited for NIR wavelengths application. Furthermore, it is found that silicon-based SPAD has higher power consumption and lower efficiency of converting NIR radiation into electrical signals. As shown in Line Y, it could be observed that the absorption coefficient of germanium is greater than silicon under radiation with wavelengths around NIR wavelengths (1550 nm). Germanium also possess the advantage of less power consumption when utilized as part of sensing element.

In order to further improve the sensitivity of sensor at NIR wavelengths, especially around 1550 nm and greater, the present disclosure provides semiconductor device(s) that could be utilized at higher range of applicable wavelength, while decreasing power consumption, improving photo-detection efficiency, and could be operated with lower operation voltage (for example, <10V). Line Z shows an example of a device of present disclosure (germanium in silicon) that has an improved sensitivity of sensor at NIR wavelengths.

Furthermore, the upper limit of substantially operable wavelength can be affected lay the amount of stress applied to the sensing material. Therefore, by forming a sensing material in a recess defined by another material having different lattice constant, the upper limit of the operable wavelength of said sensing material can be altered. In addition, compared to epitaxial growth of a sensing material on a planar surface of another material, epitaxially grown the sensing material in a recess defined by another material having different lattice constant may alleviate the issue of lattice mismatch or dislocation defects. Such approach may also improve the reliability of the sensing device.

The embodiment(s) discussed in FIG. 2A to FIG. 4K further provides an approach of forming a multiplication zone in an absorption layer (such as germanium or other suitable material); the embodiment(s) discussed in FIG. 5A to FIG. 7K further provides an approach of forming a multiplication zone in a substrate; the embodiment(s) discussed in FIG. 8A to FIG. 10D further provides an approach of forming multiplication zone as well as deep well and the heavily doped region laterally surrounding the multiplication layer in the absorption layer.

Figure 2A:
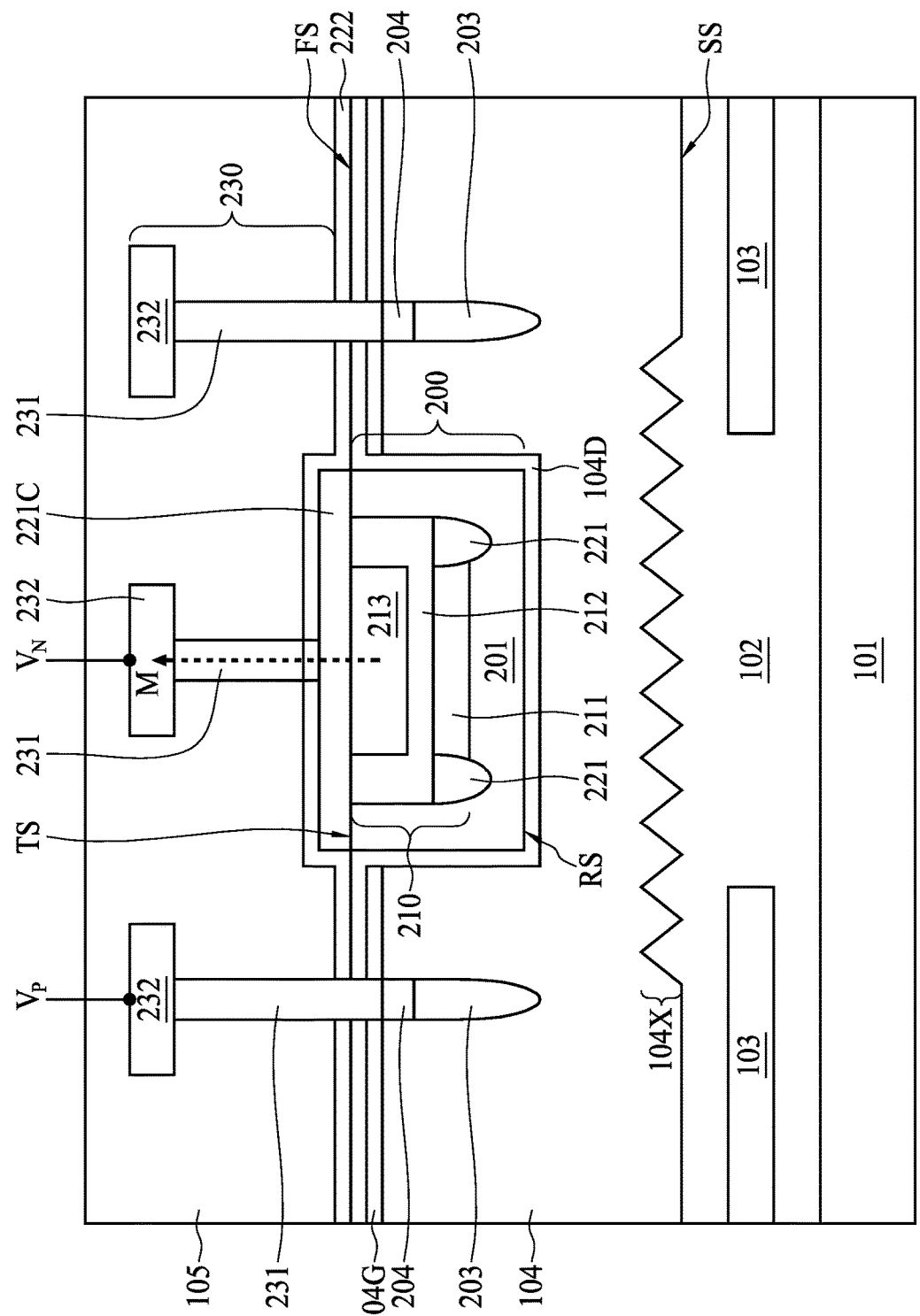
FIG. 2A is a cross sectional view of a semiconductor device, according to some embodiments of the present disclosure.

Referring to FIG. 2A, FIG. 2A is a cross sectional view of a semiconductor device, according to some embodiments of the present disclosure. The image sensor device 1 at least includes a substrate 104, one or more image sensor element 200 at a first surface FS of the substrate 104, and an interconnect structure 230 over a signal transmitting surface TS of the image sensor element 200 (which is a surface proximal to the first surface FS of the substrate 104). The substrate 104 includes a first material, wherein the first material generates electrical signals from radiation within a first range of wavelengths; the image sensor element 200 includes a second material, wherein the second material generates electrical signals from radiation within a second range of wavelengths, and the second range is different from first range. Alternatively stated, the first material is different from the second material.

In some embodiments, the substrate 104 includes silicon, alternatively or additionally, the substrate 104 includes another material, such as silicon carbide, gallium arsenide, gallium phosphide, germanium, indium phosphide, indium arsenide, and/or indium antimonide, or, an alloy semiconductor, such as silicon germanium (SiGe), GaAsP, AlInAs, AlGaAs, GaInAs, GaInP, and/or GaInAsP; or combinations thereof. In some other embodiments, substrate 104 includes one or more group III-V materials, one or more group materials, or combinations thereof. In some other embodiments, the substrate 104 is a semiconductor-on-insulator substrate, such as a silicon-on-insulator (SOI) substrate, a silicon germanium-on-insulator (SGOI) substrate, or a germanium-on-insulator (GOI) substrate. In some of the embodiments, the substrate 104 includes a dielectric layer 104G over the signal transmitting surface TS, which may include undoped silicate glass (USG) layer or other suitable material.

For example, in the application of devices that are suitable for operation at NIR eye-safe wavelengths, silicon (Si) can be selected as the first material, and germanium (Ge) can be selected as the second material. It should be noted that other suitable materials that can be operated at NIR eye-safe wavelengths can also be utilized.

The image sensor element 200 may constitute a portion of a single photon avalanche diode (SPAD) image sensor, which may be able to detect photons and convert the detected photons into electrical signals. In some embodiments, the image sensor element 200 includes an absorption layer 201 at the first surface FS of the substrate 104, and a multiplication zone 210 in the absorption layer 201. The absorption layer 201 includes second material, such as germanium or other suitable material. The multiplication zone 210 may include dopant regions or wells, which will be discussed subsequently.

The absorption layer 201 may receive radiation from a light receiving surface RS (or can be referred to as backside) of the image sensor device 1. In some embodiments, the image sensor device 1 may include a transparent layer 102 at the second surface SS opposite to the first surface FS of the substrate 104, wherein the transparent layer 102 is made of a material that is transparent to radiation within the second range of wavelength or allows at least a portion of the incident radiation to traverse thereacross and reaches the absorption layer 201. In some of the embodiments, the image sensor device 1 may further include a shielding layer 103 to define sensing area and block a portion of the incident radiation to alleviate interference. The shielding layer 103 may be disposed in the transparent layer 102, or alternatively, attached to or overlapping with the transparent layer 102. The shielding layer 103 may be made of metal or other suitable materials. In some of the embodiments, the image sensor device 1 may further include a filter layer 101 at a surface of the transparent layer 102 facing the second surface SS of the substrate 104, which may include a color filter material. For example, the filter layer 101 can be configured to filter radiation within certain wavelength range, such as filtering a portion of visible blue light.

In some of the embodiments, the image sensor device 1 may further include a microstructure portion 104X at an interface between the substrate 104 and the transparent layer 102. The microstructure portion 104X may include textured silicon (or other suitable materials), and the microstructure portion 104X may be located at a position directly below the absorption layer 201 (i.e. proximal to the filter layer 101). In some embodiments, a cross-section shape of the microstructure portion 104X can be, for example, triangle, trapezoid, arc, semi-circle, semi-ellipse, or the like. In some embodiments, a shape of the microstructure portion 104X can be, for example, substantial right pyramid shape, triangular pyramid shape, cone shape, hemispherical shape, hemi-ellipsoid, or the like. It is noted that it is not limited that each of the microstructure portion 104X has exact same shape. The microstructure portion 104X is configured to enhance light absorption by minimizing reflection at the interface of the substrate 104 and the transparent layer 102. In some embodiments, the microstructure portion 104X overlaps the portion of transparent layer 102 that is not blocked by the shielding layer 103. In some alternative embodiments, waveguide structures may be disposed in or overlapping with the transparent layer 102 to alter the direction or path of incident radiation.

Figure 2B:
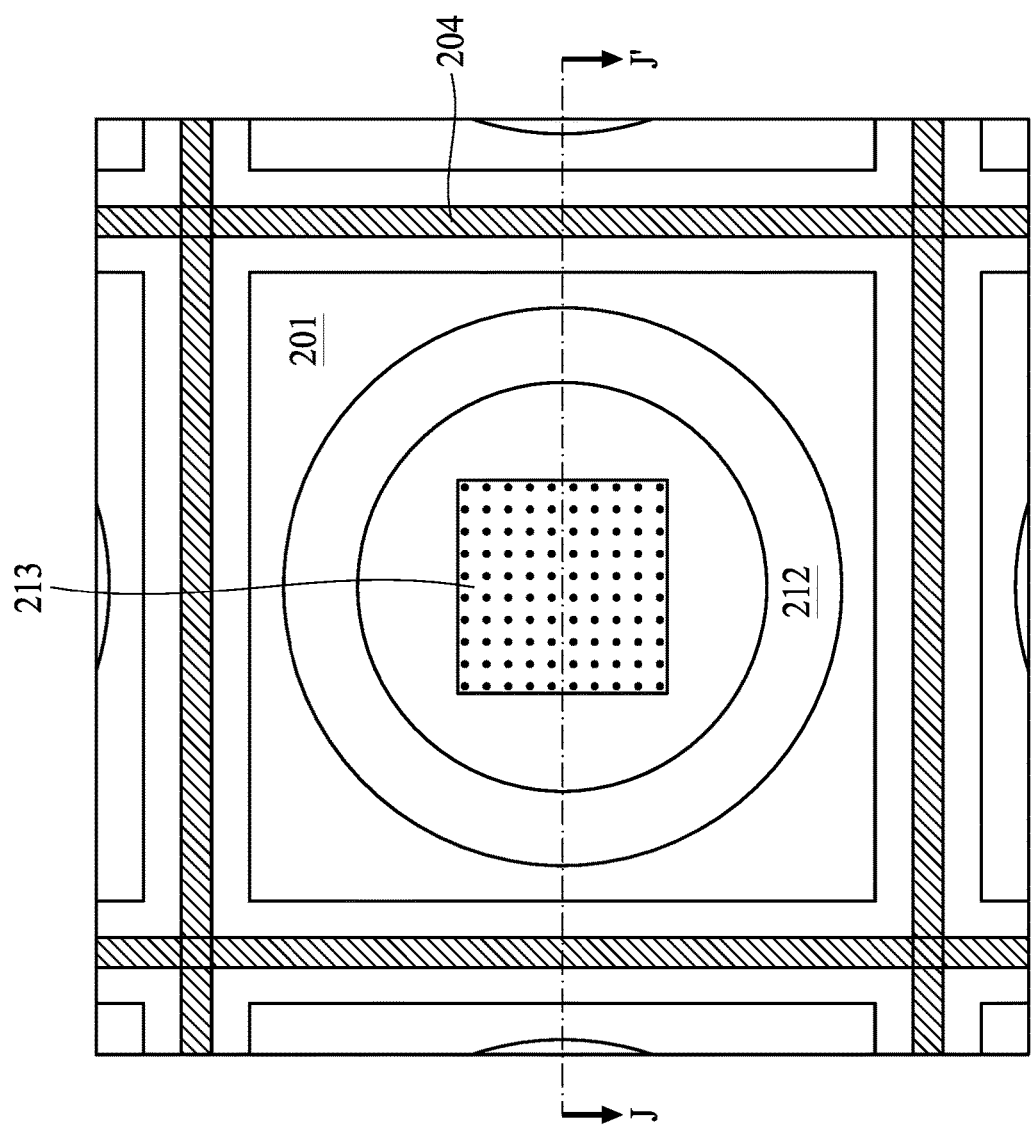
FIG. 2B is a top view of a semiconductor device, according to some embodiments of the present disclosure.

Referring to FIG. 2A and FIG. 2B, FIG. 2B is a top view of a semiconductor device, according to some embodiments of the present disclosure. It should be noted that in some of the embodiments, FIG. 2A may be a cross sectional view of a semiconductor structure along a line J-J' in FIG. 2B. In some embodiments, the second material (such as germanium) is formed by epitaxial growth. In a comparative embodiment of forming germanium over a flat silicon surface, the growth of germanium may be irregular and the entire profile is difficult to control. Therefore, in some embodiments of the present disclosure, the image sensor element 200 is formed in a recessed area of the substrate 104. The issue of lattice mismatch or dislocation defects may be alleviated due to improved crystalline stress (or strain), thereby the sensitivity of responding to radiation at NIR wavelengths and/or radiation around/higher than 1.55 μm can be improved. It may be also easier to control the growth of the second material (such as germanium) during fabrication stages. In some embodiments, the signal transmitting surface TS of the image sensor element 200 (or referred as the signal transmitting surface TS of the absorption layer 201) is coplanar with the first surface FS of the substrate 104. In some embodiments, the substrate 104 further includes an interfacial layer 104D over the first surface FS of the substrate 104 and conforming a surface of the recessed portion of the substrate 104. The interfacial layer 104D may be doped with dopant having first conductivity type. For example, the first conductivity type may be P type and the dopant may be boron (B). In some embodiments, a concentration of dopant in the interfacial layer 104D is in a range from about 1e16 $cm^{-3}$ to about 1e18 $cm^{-3}$. In some embodiments, the interfacial layer 104D can be configured to guide away leakage current. In some of the embodiments, the interfacial layer 104D may have a surface that is suitable for epitaxial growth and thereby further alleviating the issue of lattice mismatch.

In an example provided in FIG. 2B, a shape of the image sensor element 200 (or the absorption layer 201) may be similar to quadrilateral shape from a top view perspective. However, it should be noted that the shape of the image sensor element 200 (or the absorption layer 201) from a top view perspective can also be circular or other suitable shape.

In some embodiments, each of the image sensor element 200 is laterally surrounded by a first heavily doped region 204. The first heavily doped region 204 may be doped with dopant having first conductivity type, such as boron (B) in the cases of first conductivity type being P type. In some embodiments, a concentration of dopant in the first heavily doped region 204 may be in a range from about 1e18 $cm^{-3}$ to about 1e21 $cm^{-3}$. The image sensor device 1 may further include a first deep well 203 under the first heavily doped region 204 in a vertical direction and laterally surrounding each of the image sensor element 200. A distance between the first deep well 203 and the second surface SS of the substrate 104 is less than a distance between the first heavily doped region 204 and the second surface SS of the substrate 104. The first deep well 203 may be doped with dopant having first conductivity type. In some embodiments, a concentration of dopant in the first deep well 203 may be in a range from about 1e15 $cm^{-3}$ to about 1e17 $cm^{-3}$. In some embodiments, the first deep well 203 may be formed by multi-step doping operation with different depths. Each of the image sensor element 200 is separated from each other and laterally surrounded by first heavily doped region 204 and the first deep well 203, thereby alleviating interference from adjacent image sensor elements. In some embodiments, a substantially undoped portion of the substrate 104 is between the sidewall of the absorption layer 201 and the first heavily doped region 204/the first deep well 203.

A multiplication zone 210 is formed in the absorption layer 201. Electrons converted from photon may drift into the multiplication zone and can trigger avalanche effect. The avalanche effect occurs at heterojunction interface between two (or more) implant regions with different conductivity type, for example, at a heterojunction between P type region and N type region. Therefore, the multiplication zone 210 is configured to have a dopant profile that is suitable for triggering avalanche effect and guiding the generated electron. In some embodiments, the multiplication zone 210 includes a second heavily doped region 213 proximal to the signal transmitting surface TS of the absorption layer 201, a well region 212 below the second heavily doped region 213, and a second deep well 211 below the well region 212. In some embodiments, a portion of the well region 212 is proximal to the signal transmitting surface TS of the absorption layer 201 and laterally surrounding the second heavily doped region 213. In some of the embodiments, the entire second deep well 211 is within a coverage of a vertical projection area of the well region 212.

In some embodiments, the second heavily doped region 213 is doped with dopant having second conductivity type different from the first conductivity type. For example, the second conductivity type may be N type, and the dopant may be phosphorus, arsenic, or the like. In some embodiments, a concentration of dopant in the second heavily doped region 213 may be in a range from about 1e18 $cm^{-3}$ to about 1e21 $cm^{-3}$.

In some embodiments, the well region 212 is doped with dopant having second conductivity type (in the case of second conductivity type being N type, the dopant may be phosphorus, arsenic, or the like). In some embodiments, a concentration of dopant in the well region 212 may be in a range from about 1e15 $cm^{-3}$ to about 1e18 $cm^{-3}$.

In some embodiments, the second deep well 211 is doped with dopant having first conductivity type (in the case of first conductivity type being P type, the dopant may be boron, or the like). In some embodiments, a concentration of dopant in the second deep well 211 may be in a range from about 1e15 $cm^{-3}$ to about 1e18 $cm^{-3}$. The interface between the well region 212 (doped with second conductivity type) and the second deep well 211 (doped with first conductivity type) is in the absorption layer 201.

In some embodiments, the image sensor element 200 further includes a guard ring 221 in the absorption layer 201, below the well region 212 and laterally surrounding the second deep well 211. In some embodiments, a bottom of the second deep well 211 is above a bottom of the guard ring 221. In some embodiments, the guard ring 221 is doped with dopant having second conductivity type (in the case of second conductivity type being N type, the dopant may be phosphorus, arsenic, or the like). In some embodiments, a concentration of dopant in the guard ring 221 may be in a range from about 1e15 $cm^{-3}$ to about 1e17 $cm^{-3}$. The guard ring 221 may alleviate the issue of leakage current. In some of the embodiments, an outer edge of the guard ring 221 may be aligned with an outer edge of the well region 212, but the present disclosure is not limited thereto.

The image sensor device 1 may further include a silicon capping layer 221C covering the signal transmitting surface TS of the absorption layer 201, a protection film 222 over the silicon capping layer 221C and a top surface 104 of the semiconductor substrate 104, an insulation layer 105 over the protection film 222 and the substrate 104, and an interconnect structure 230 in the insulation layer 105. In some embodiments, the protection film 222 may include oxide, or other suitable insulating material. The interconnect structure 230 may include a plurality of conductive vias 231 electrically coupled to the signal transmitting surface TS of the absorption layer 201 (in some cases, conductive vias 231 are physically connected to a top surface of the silicon capping layer 221C) and the first heavily doped region 204. The interconnect structure 230 may further include metal lines 232 electrically connected to the conductive vias 231 for guiding the generated electron signals. An example of a guiding path of an electrical signal is presented as dotted lines with an arrow M in FIG. 2A. The operation voltage may be applied through the interconnect structure 230. For example, the multiplication zone 210 is applied with first bias voltage $V_N$ and the first heavily doped region 204 is connected to second bias voltage $V_P$. In some embodiments, first bias voltage $V_N$ is in a range from about 0V to about 20V, and second bias voltage $V_P$ is about 0V, however the present disclosure is not limited thereto. In some embodiments, an operation voltage of the image sensor device 1 can be lowered (for example to 10V) due to the advantage of this configuration.

It should be noted that, the example(s) of the first conductivity type being P type and the second conductivity type being N type is discussed in the embodiments of FIG. 2A to FIG. 2B (and in the subsequent embodiments discussed in FIG. 3 to FIG. 4K as well as the embodiments subsequently discussed in FIG. 5A to 7K or FIG. 8A to FIG. 10D), however, alternatively first conductivity type can be N type and the second conductivity type can be P type.

Figure 3:
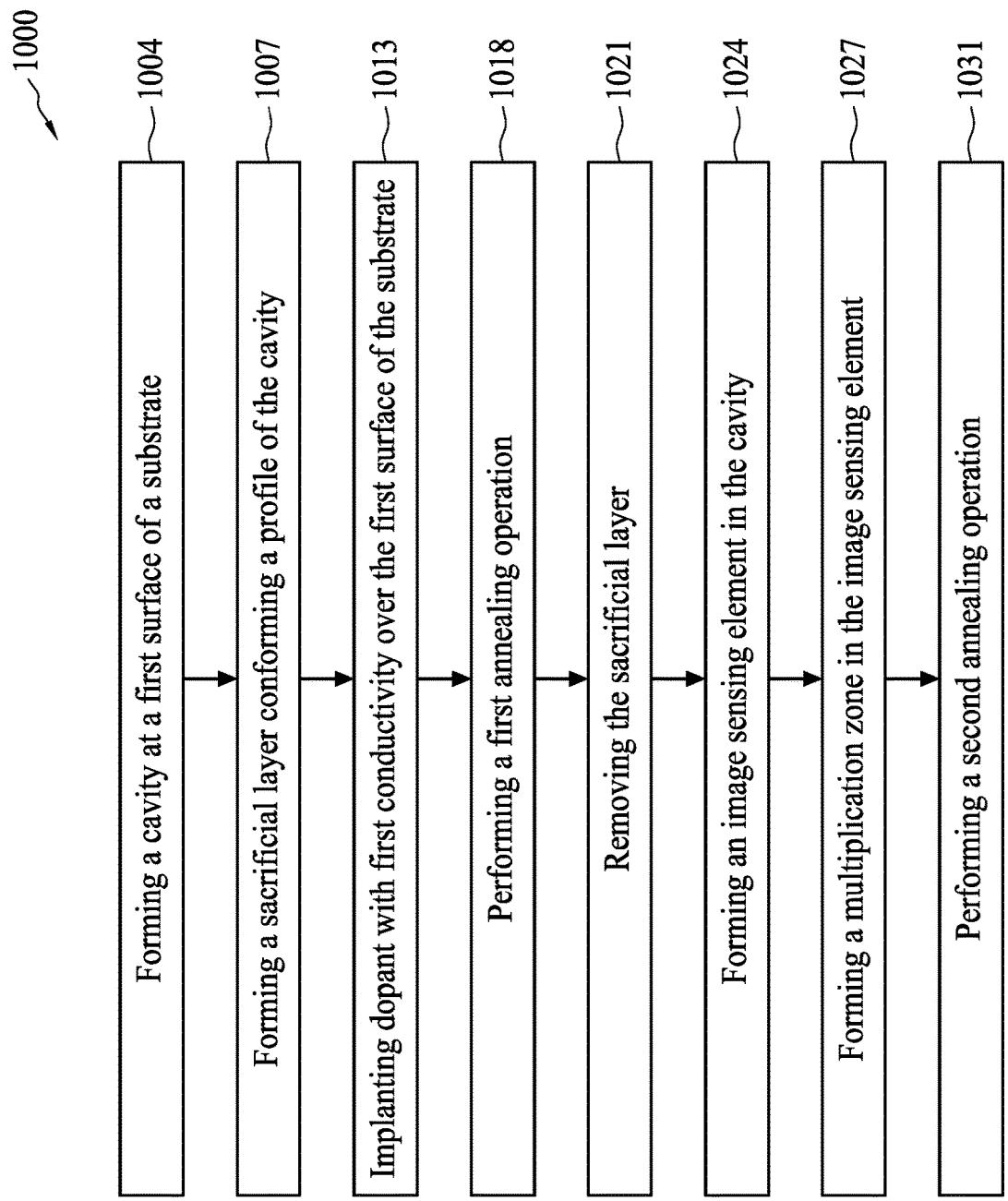
FIG. 3 shows a flow chart describing a method for fabricating a semiconductor device, in accordance with some embodiments of the present disclosure.

Referring to FIG. 3, FIG. 3 shows a flow chart describing a method for fabricating a semiconductor device, in accordance with some embodiments of the present disclosure. The method 1000 for fabricating the image sensor device 1 includes forming a cavity at a first surface of a substrate (operation 1004, which can be referred to FIG. 4D), forming a sacrificial layer conforming a profile of the cavity (operation 1007, which can be referred to FIG. 4E), implanting dopant with first conductivity over the first surface of the substrate (operation 1013, which can be referred to FIG. 4F), performing a first annealing operation (operation 1018, which can be referred to FIG. 4F), removing the sacrificial layer (operation 1021, which can be referred to FIG. 4G), forming an image sensing element in the cavity (operation 1024, which can be referred to FIG. 4H), forming a multiplication zone in the image sensing element (operation 1027, which can be referred to FIG. 4J), and performing a second annealing operation (operation 1031, which can be referred to FIG. 4J).

Figure 4A:
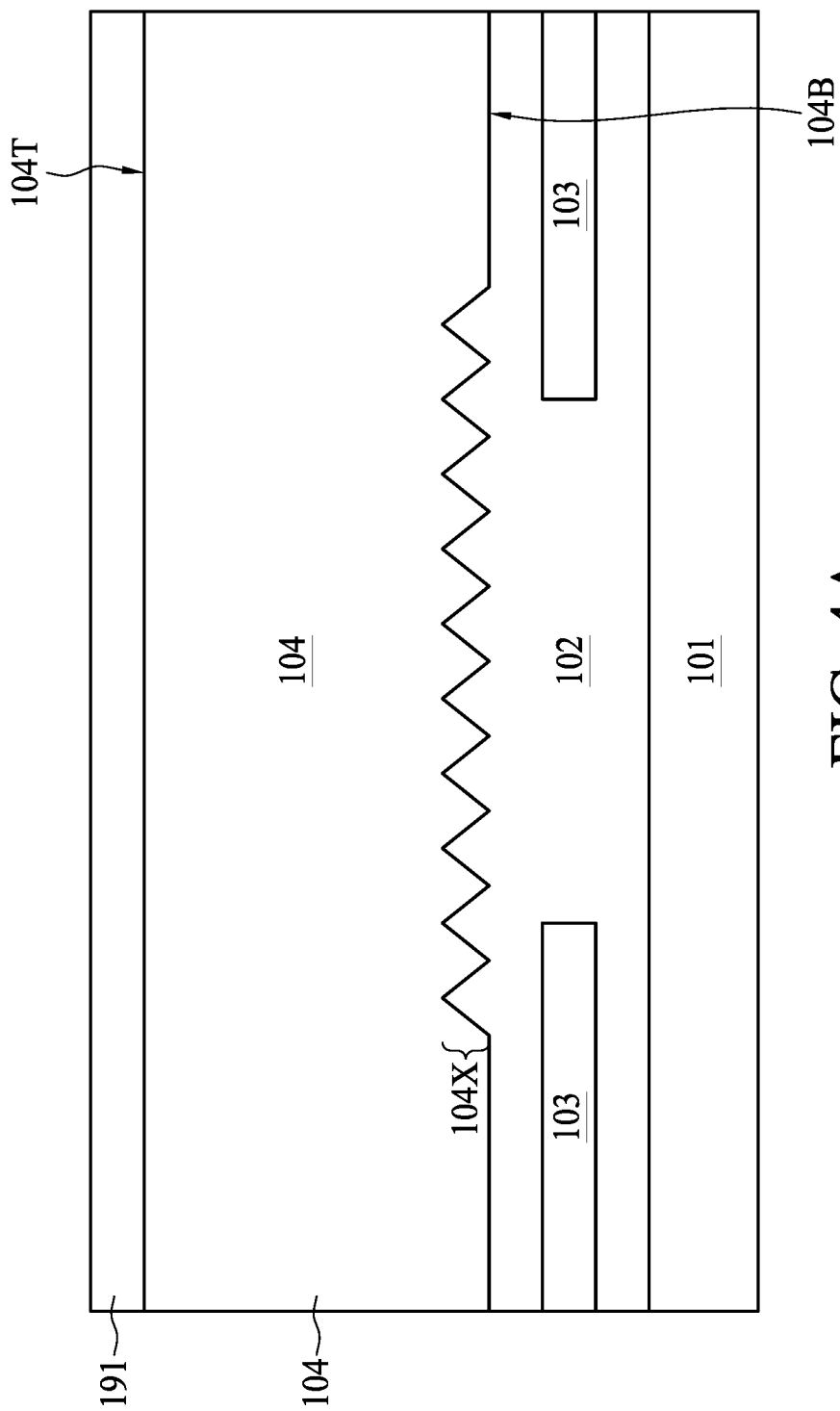
FIG. 4A to FIG. 4K are cross sectional views of a semiconductor device during intermediate stages of manufacturing operations, according to some embodiments of the present disclosure.

Referring to FIG. 4A, FIG. 4A is a cross sectional view of a semiconductor device during intermediate stages of manufacturing operations, according to some embodiments of the present disclosure. A substrate 104 including first material is provided, wherein the details of the substrate 104 can be referred to the discussion in FIG. 2A. In some embodiments, the first material may include silicon. A transparent layer 102 is formed over a back surface 104B of the substrate 104, wherein the transparent layer 102 is made of a material that allows at least a portion of the incident radiation to traverse thereacross. In some embodiments, a shielding layer 103 is formed to define sensing area. The shielding layer 103 may be disposed in the transparent layer 102, or alternatively, attached to or overlapping with the transparent layer 102. The shielding layer 103 may be made of metal or other suitable materials. A filter layer 101 may be formed over a back surface of the transparent layer 102 opposite to the substrate 104. The filter layer 101 can be configured to filter radiation within certain wavelength range, such as visible blue light. In some embodiments, a microstructure portion 104X may be formed at an interface between the transparent layer 102 and the substrate 104 (The details with regard to the microstructure portion 104X can be referred to FIG. 2A). In some embodiments, the microstructure portion 104X may be formed by laser treatment, etching operation, mechanical ablation, photolithography operation, and/or other suitable operation. A first sacrificial layer 191 is formed over a top surface 104T of the substrate 104. In some embodiments, the first sacrificial layer 191 may include oxide. The first sacrificial layer 191 may be patterned.

Figure 4B:
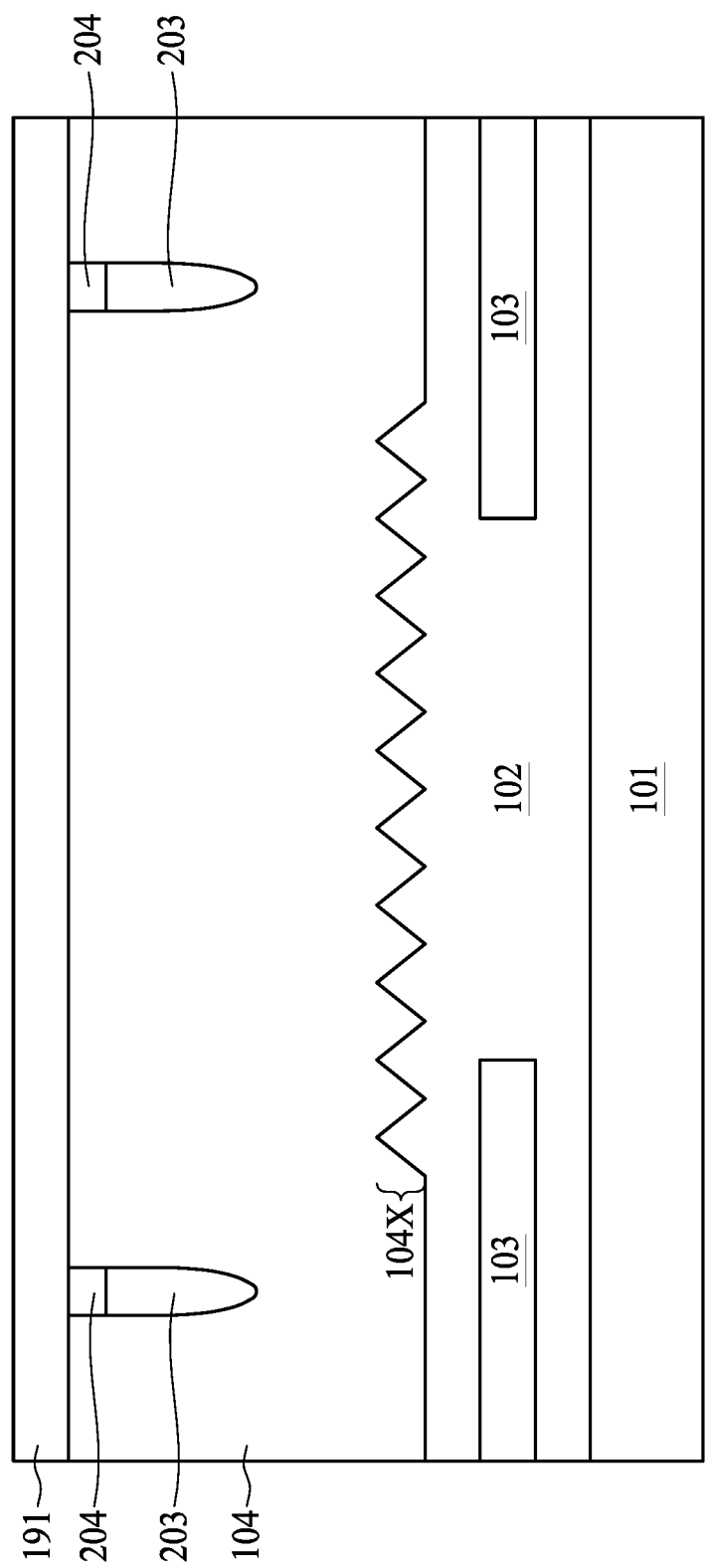

Referring to FIG. 4B, FIG. 4B is a cross sectional view of a semiconductor device during intermediate stages of manufacturing operations, according to some embodiments of the present disclosure. A first heavily doped region 204 and a first deep well 203 is formed by implantation operation using the first sacrificial layer 191 deposited over the top surface 104T of the substrate 104. In some embodiments, the first heavily doped region 204 and the first deep well 203 are doped with dopant having first conductivity type. In the case of the first conductivity type being P type, the dopant may be boron (B). In some embodiments, the first deep well 203 may be formed by mufti-step doping operation. For example, the first deep well 203 may be formed by a first step of doping first conductivity type dopant with a doping profile depth in a range from about 0.1 μm to about 3 μm and with a concentration in a range from about 1e15 $cm^{-3}$ to about 1e17 $cm^{-3}$, followed by a second step of doping first conductivity type dopant having a doping profile depth in a range from about 0.1 μm to about 1 μm with a concentration in a range from about 1e15 $cm^{-3}$ to about 1e17 $cm^{-3}$. In some embodiments, a concentration of dopant in the first heavily doped region 204 may be in a range from about 1e18 $cm^{-3}$ to about 1e21 $cm^{-3}$, and a doping profile depth of the first heavily doped region 204 may be in a range from about 0.01 μm to about 0.1 μm. In some of the embodiments, the first deep well 203 is formed prior to forming the first heavily doped region 204. However, in some alternative cases, the first deep well 203 can also be formed after forming the first heavily doped region 204. In some of the embodiments, an annealing operation is performed after the formation of the first heavily doped region 204 and the first deep well 203. The suitable annealing temperature used in the aforesaid annealing operation may be greater than that used in the subsequent annealing operations after the doped well regions in the absorption layer 201 is formed.

Figure 4C:
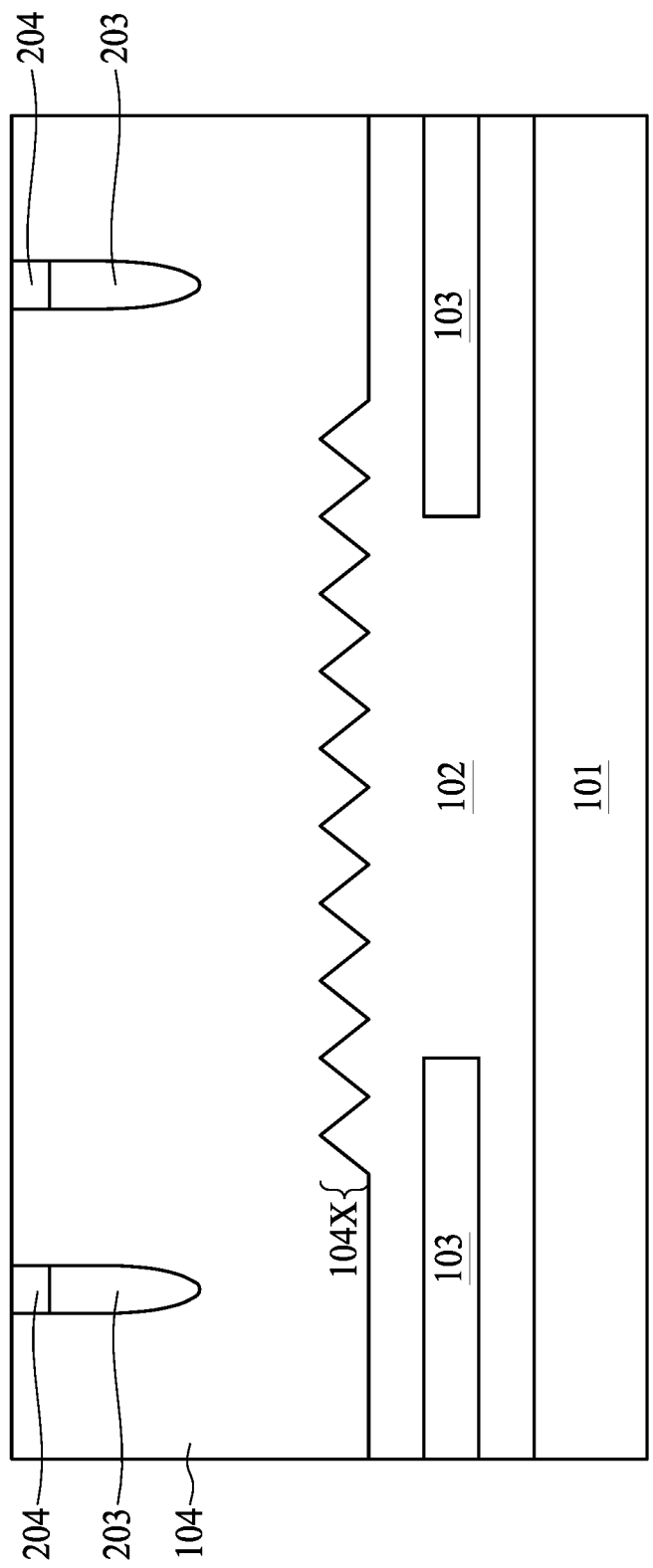

Referring to FIG. 4C, FIG. 4C is a cross sectional view of a semiconductor device during intermediate stages of manufacturing operations, according to some embodiments of the present disclosure. Subsequent to forming the first heavily doped region 204 and the first deep well 203, the first sacrificial layer 191 is removed.

Figure 4D:
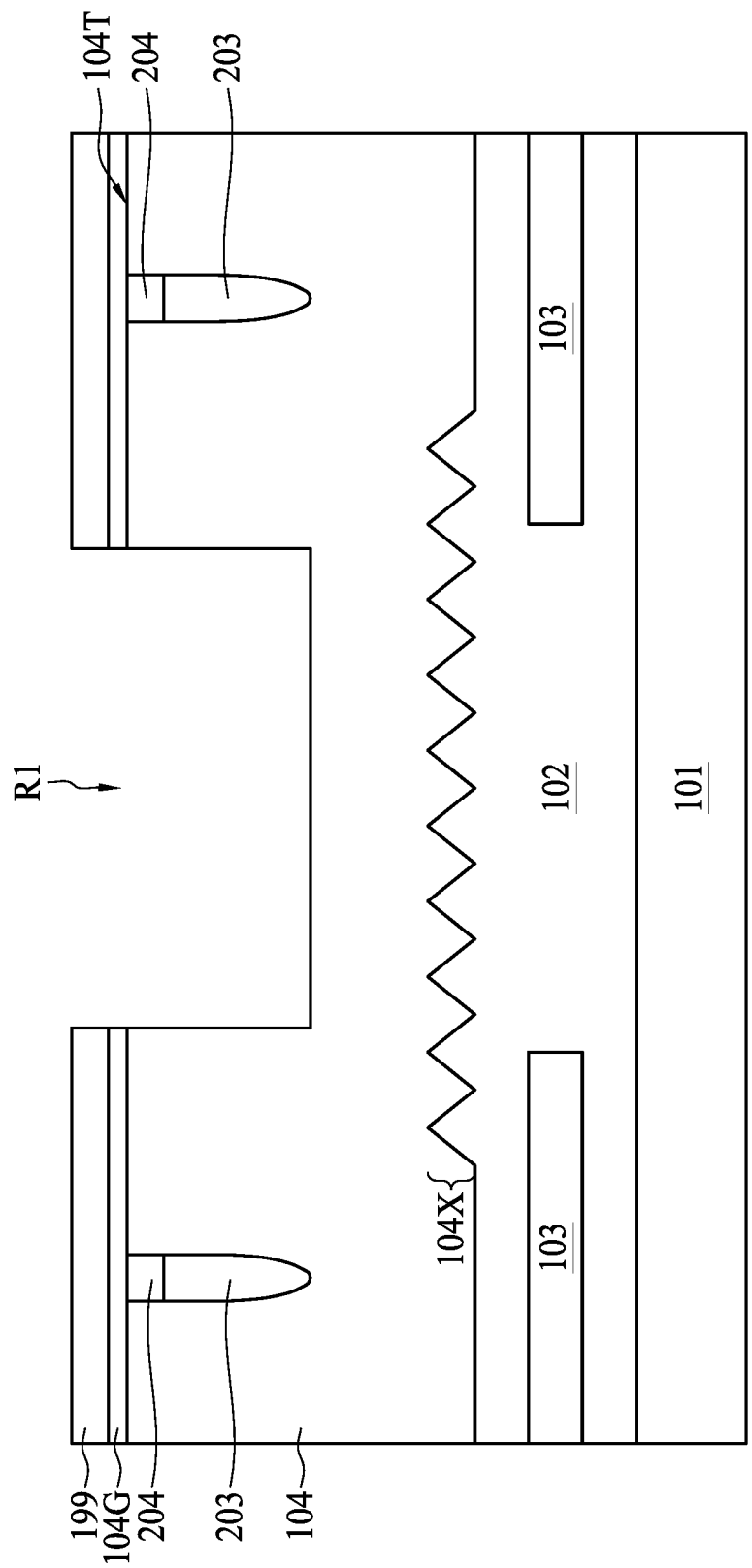

Referring to FIG. 4D, FIG. 4D is a cross sectional view of a semiconductor device during intermediate stages of manufacturing operations, according to some embodiments of the present disclosure. A dielectric layer 104G is formed at the top surface 104T of the substrate 104. In some embodiments, the dielectric layer 104G includes undoped silicate glass (USG) layer. A photoresist layer 199 is formed and patterned over the dielectric layer 104G. A photolithography operation is performed to form a cavity R1 at the top surface 104T of the substrate 104. In some embodiments, the cavity R1 may have a shape similar to quadrilateral shape from a top view perspective. In some alternative embodiments, the shape of the cavity R1 may be similar to circular or other suitable shape from a top view perspective. The cavity R1 is at a position laterally surrounded by the first deep well 203 and the first heavily doped region 204. The photoresist layer 199 is removed subsequently.

Figure 4E:
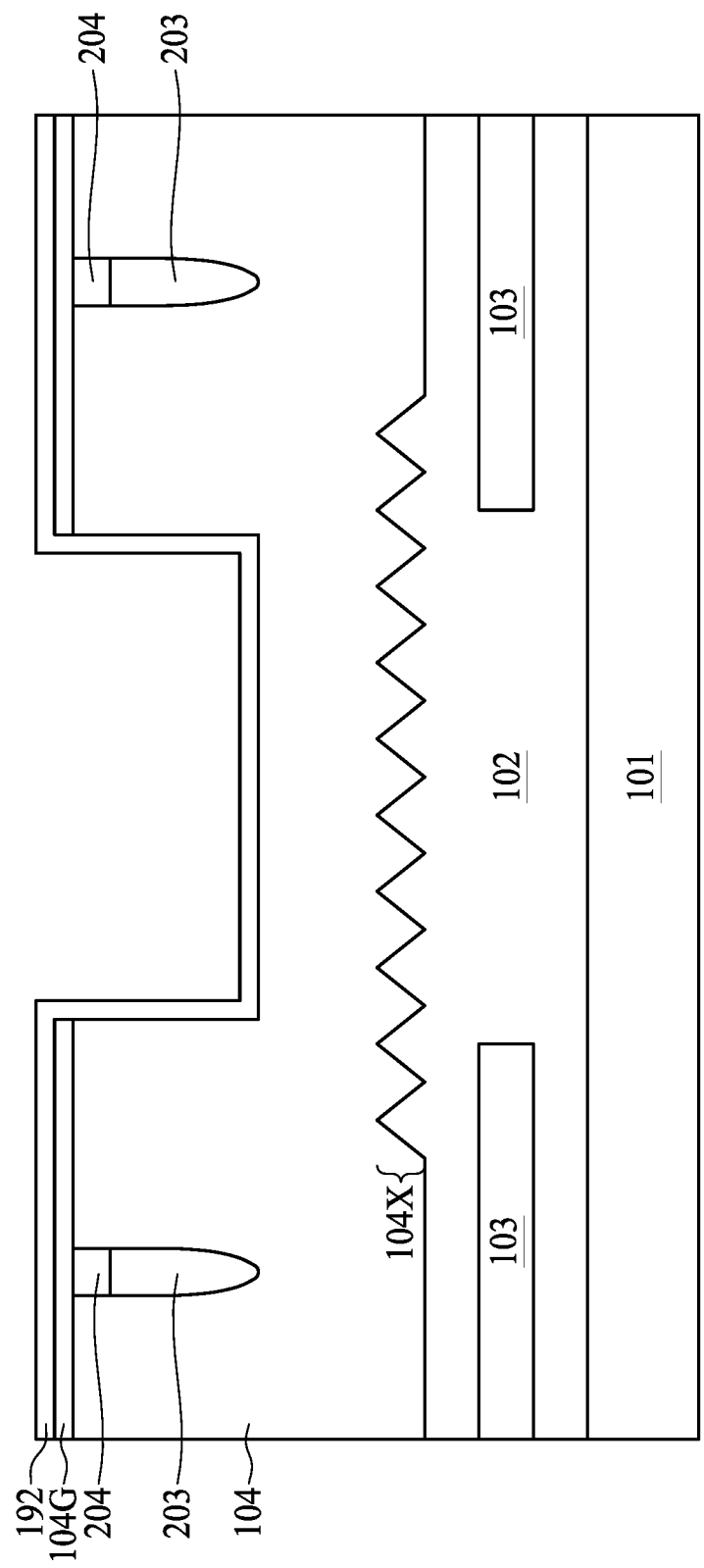

Referring to FIG. 4E, FIG. 4E is a cross sectional view of a semiconductor device during intermediate stages of manufacturing operations, according to some embodiments of the present disclosure. A second sacrificial layer 192 conforming the sidewall and the bottom of the cavity R1 is formed by deposition operation. The second sacrificial layer 192 may further extend over a top surface of the dielectric layer 104G. In some embodiments, the second sacrificial layer 192 may include oxide. In some of the embodiments, the second sacrificial layer 192 can be patterned.

Figure 4F:
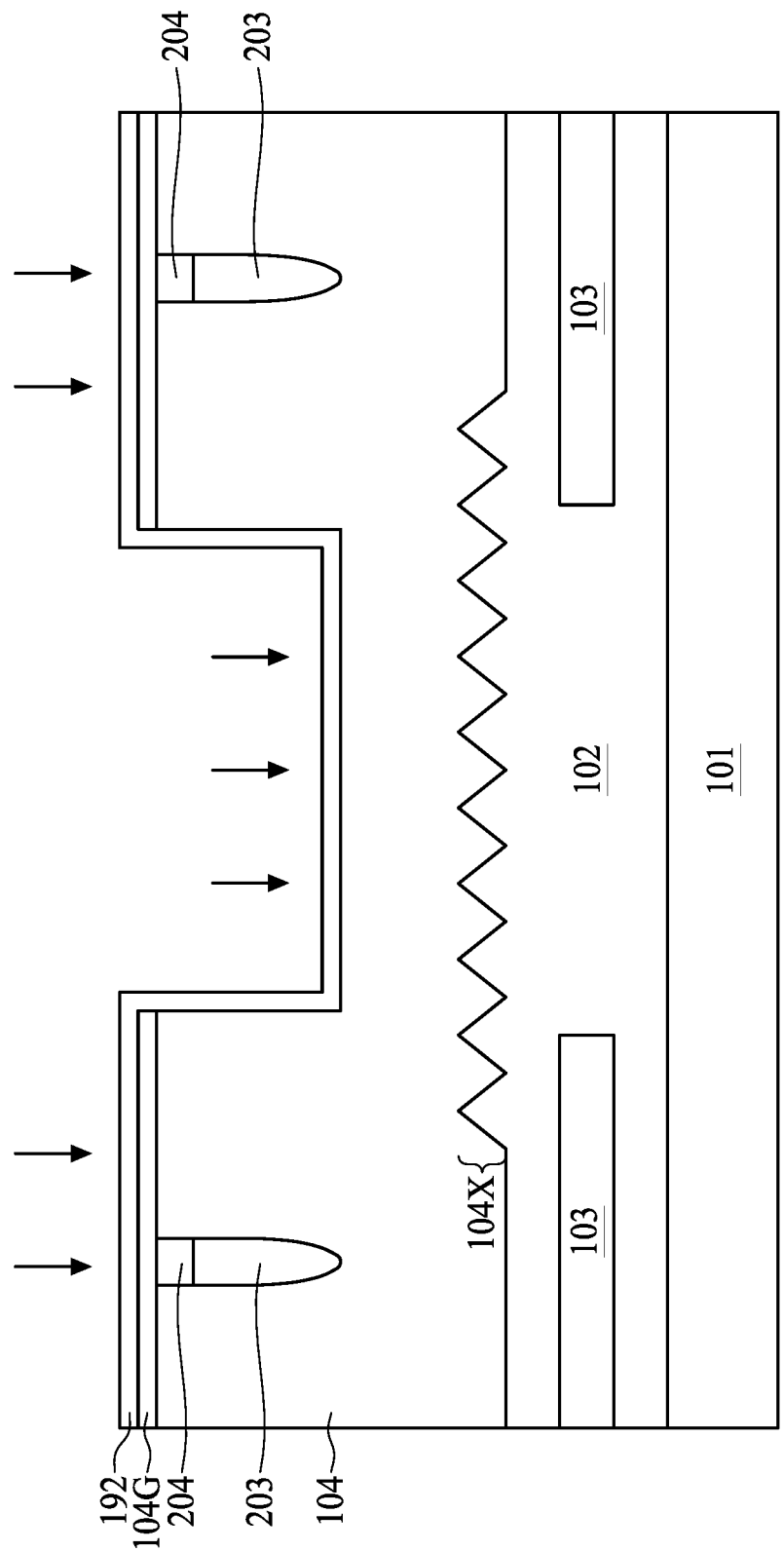
Figure 4G:
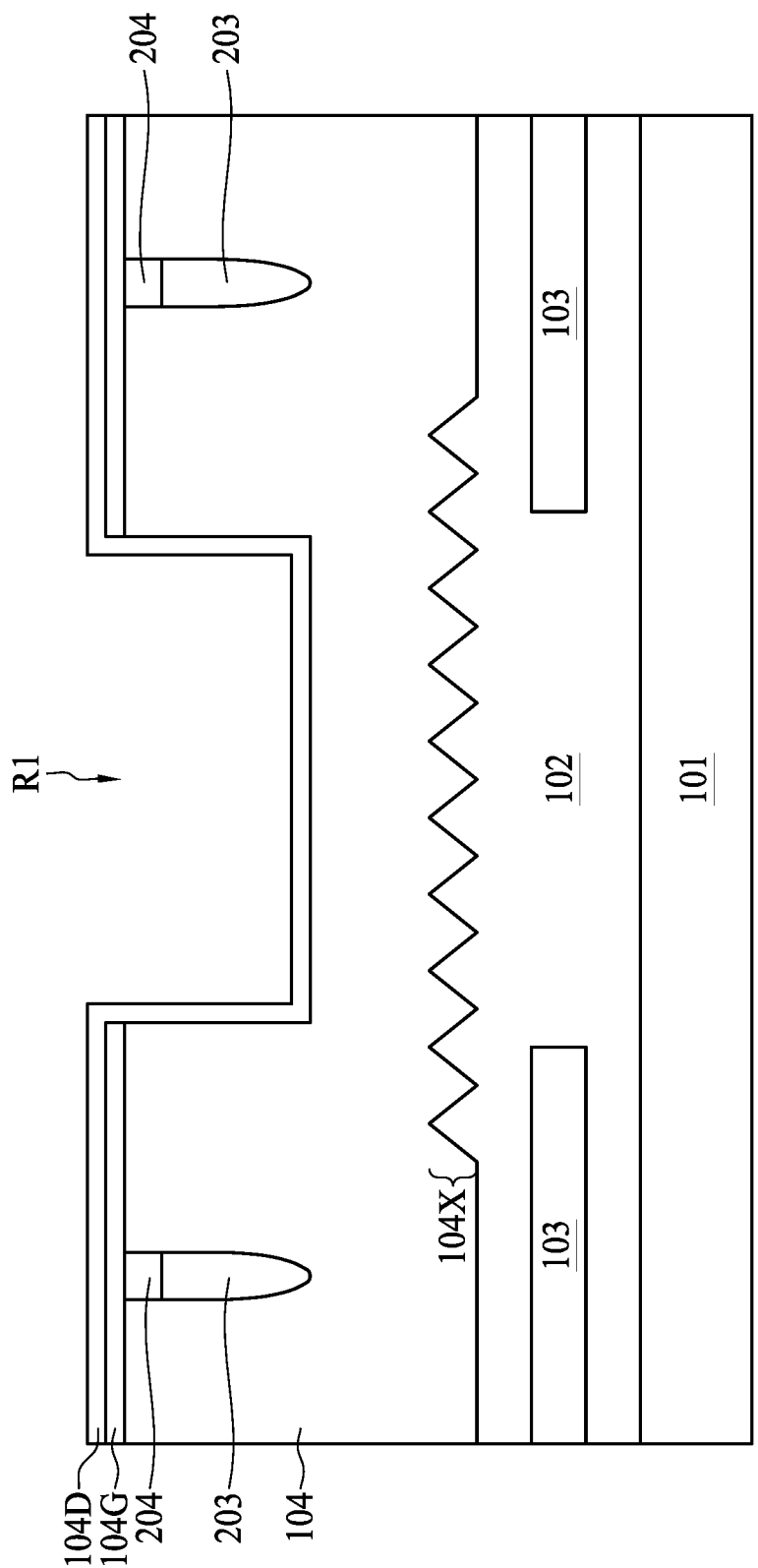

Referring to FIG. 4F, FIG. 4F is a cross sectional view of a semiconductor device during intermediate stages of manufacturing operations, according to some embodiments of the present disclosure. A blanket implantation of the dopant with first conductivity type (such as boron in the cases of first conductivity type being P type) is performed over the top surface of the second sacrificial layer 192. Subsequently, a first rapid annealing operation is performed. In some embodiments, a temperature of the first rapid thermal annealing (RTA) operation is in a range from about 1000° C. to about 1100° C. Referring to FIG. 4G, FIG. 4G is a cross sectional view of a semiconductor device during intermediate stages of manufacturing operations, according to some embodiments of the present disclosure. The second sacrificial layer 192 is removed and the interfacial layer 104D is thereby formed approximate to the surface of the cavity R1 and the top surface of the substrate 104 (or at the top surface of the dielectric layer 104G). In some embodiments, a concentration of dopant in the interfacial layer 104D may be in a range from about 1e16 $cm^{-3}$ to about 1e18 $cm^{-3}$, and a doping profile depth of the interfacial layer 104D may be adjusted by the RTA condition, for example, to be in a range from about 0.01 μm to about 0.1 μm.

Figure 4H:
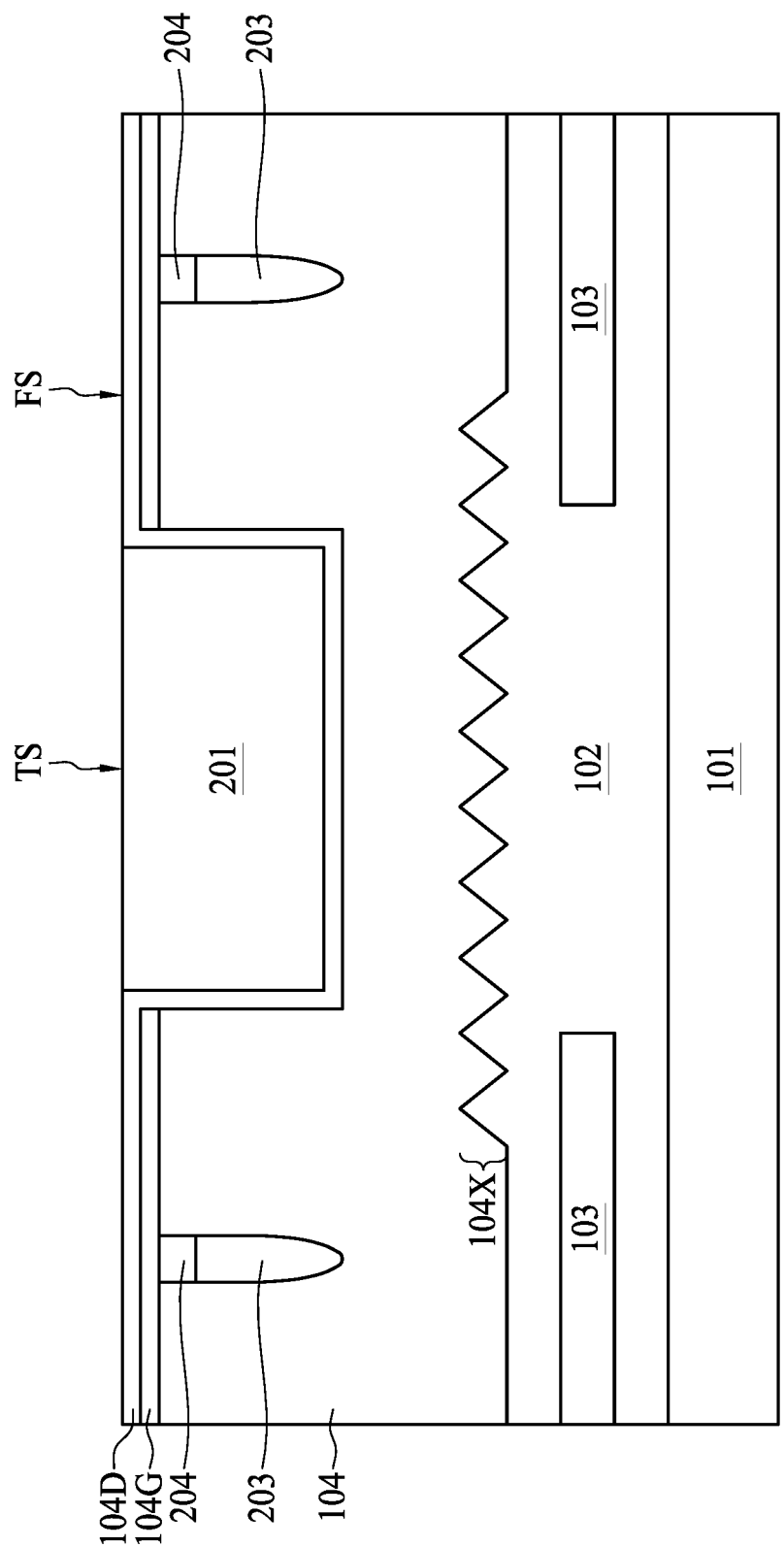

Referring to FIG. 4H, FIG. 4H is a cross sectional view of a semiconductor device during intermediate stages of manufacturing operations, according to some embodiments of the present disclosure. A second material is formed in the cavity R1 (shown in FIG. 4G) by deposition operation, wherein the second material generates electrical signals from radiation within a second range of wavelengths, and the second range is different from first range. In some embodiments, the second material may be germanium or other suitable material. In some embodiments, the deposition of the second material may include epitaxial growth and/or cleaning. As previously discussed in FIG. 2A to FIG. 2B, by forming the second material in the cavity R1 with treated surface (doped with first conductive type dopant), the issue related to lattice mismatch or dislocation may be alleviated. A chemical mechanical planarization operation is performed to remove excessive portion of the second material to form the absorption layer 201. In some embodiments, the signal transmitting surface TS of the absorption layer 201 may be coplanar with the first surface FS of the substrate 104 (alternatively, coplanar to the interfacial layer 104D of the substrate 104 or the dielectric layer 104G of the substrate 104).

Figure 4I:
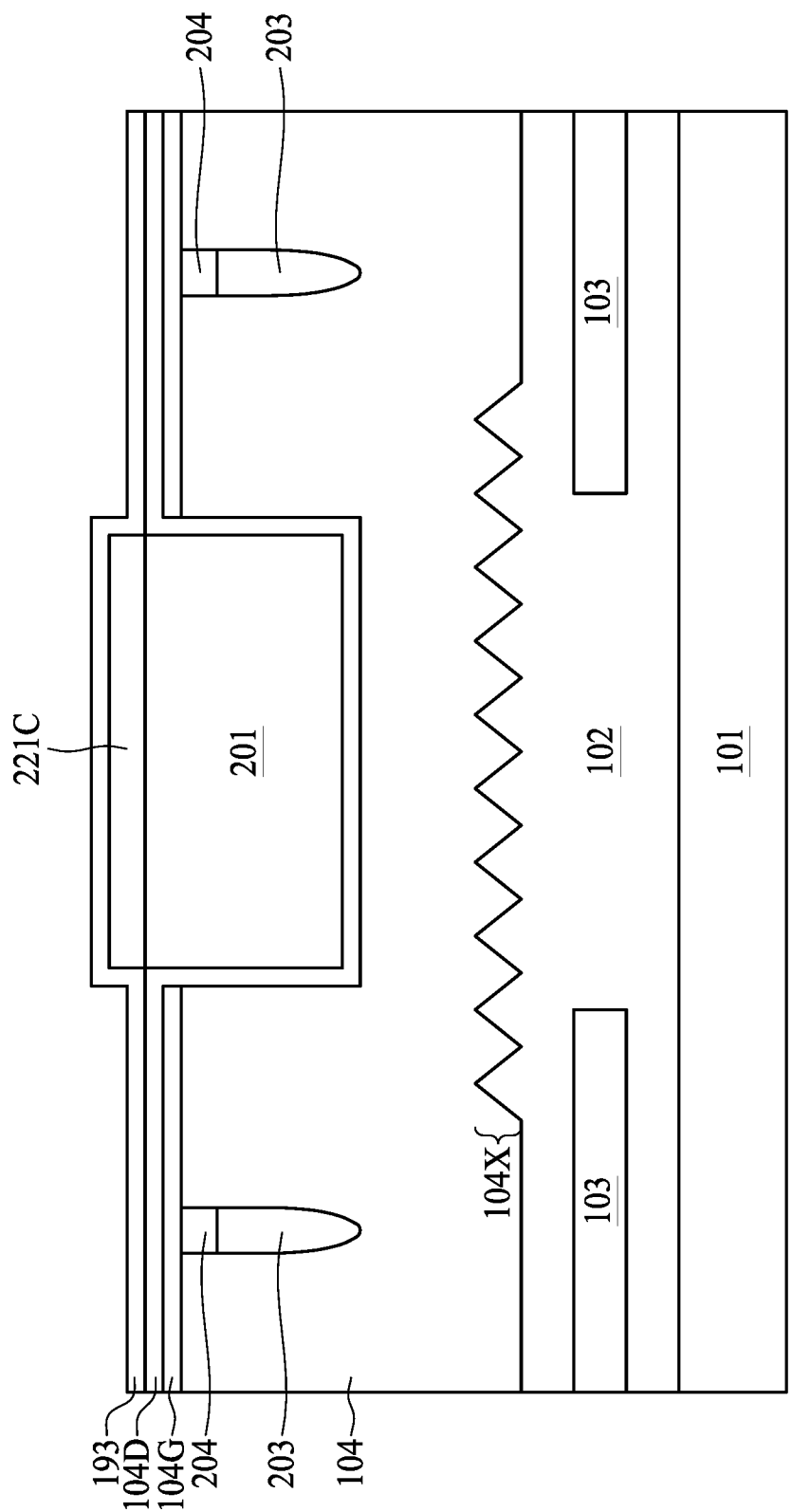

Referring to FIG. 4I, FIG. 4I is a cross sectional view of a semiconductor device during intermediate stages of manufacturing operations, according to some embodiments of the present disclosure. A silicon capping layer 221C is formed over the exposed surface of the absorption layer 201, and a third sacrificial layer 193 is formed over the silicon capping layer 221C and the top surface of the substrate 104. In some embodiments, the third sacrificial layer 193 may include oxide, or other suitable material. In some of the embodiments, the third sacrificial layer 193 may be patterned.

Figure 4J:
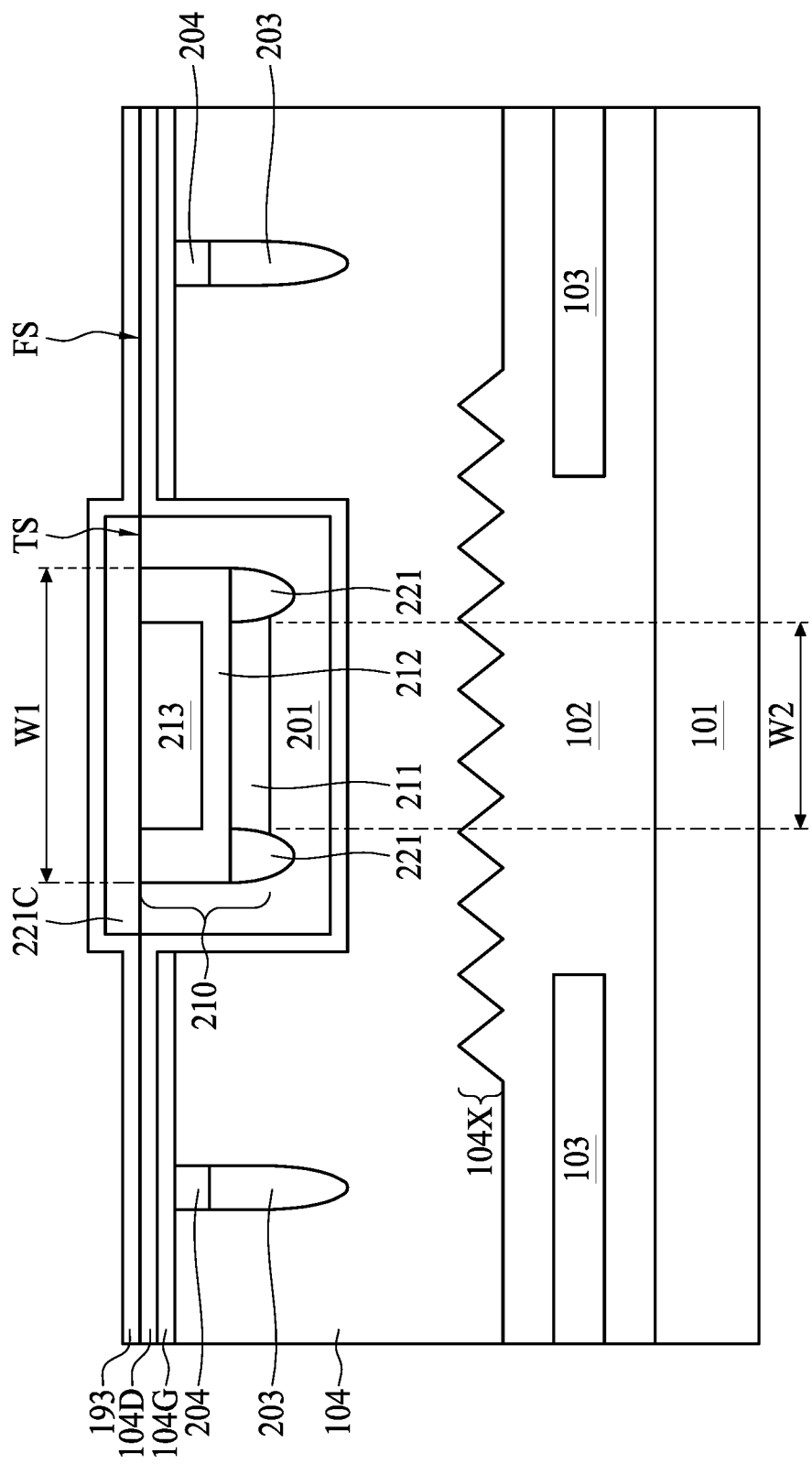

Referring to FIG. 4J, FIG. 4J is a cross sectional view of a semiconductor device during intermediate stages of manufacturing operations, according to some embodiments of the present disclosure. A guard ring 221 is formed in the absorption layer 201 by doping the dopant having second conductivity type (in the case of second conductivity type being N type, the dopant may be phosphorus, arsenic, or the like). In some embodiments, a concentration of dopant in the guard ring 221 may be in a range from about 1e15 $cm^{-3}$ to about 1e17 $cm^{-3}$, and a doping profile depth of the guard ring 221 is in a range from about 0.1 μm to about 1 μm.

A second deep well 211 is formed at a position laterally surrounded by the guard ring 221. In some embodiments, a top of the second deep well 211 is substantially leveled with a top of the guard ring 221, but the present disclosure is not limited thereto. In some embodiments, the second deep well 211 is doped with dopant having first conductivity type (in the case of first conductivity type being P type, the dopant may be boron, or the like). In some embodiments, a concentration of dopant in the second deep well 211 may be in a range from about 1e15 cm$^{-3}$ to about 1e18 cm$^{-3}$, and a doping profile depth of the second deep well 211 is in a range from about 0.1 μm to about 1 μm.

A well region 212 is formed above the second deep well 211 and the guard ring 221. In some embodiments, a width W1 of the well region 212 is greater than a width W2 of the second deep well 211. The well region 212 is doped with dopant having second conductivity type (in the case of second conductivity type being N type, the dopant may be phosphorus, arsenic, or the like). In some embodiments, a concentration of dopant in the well region 212 may be in a range from about 1e15 cm$^{-3}$ to about 1e18 cm$^{-3}$, and a doping profile depth of the well region 212 is in a range from about 0.01 μm to about 1 μm.

A second heavily doped region 213 is formed at a position proximal to the signal transmitting surface TS of the absorption layer 201 (or proximal to a bottom surface of the silicon capping layer 221C), and laterally surrounded by a portion of the well region 212. In some embodiments, the second heavily doped region 213 is doped with dopant having second conductivity type different from the first conductivity type. For example, the second conductivity type may be N type, and the dopant may be phosphorus, arsenic, or the like. In some embodiments, a concentration of dopant in the second heavily doped region 213 may be in a range from about 1e18 cm$^{-3}$ to about 1e21 cm$^{-3}$, and a doping profile depth of the second heavily doped region 213 is in a range from about 0.01 μm to about 0.1 μm. A depth of the second heavily doped region 213 is less than a depth of the well region 212.

In some embodiments, the formation may be in the sequence of guard ring 221 at first, followed by the second deep well 211, the well region 212, and the second heavily doped region 213. However, it should be noted that one can adjust the sequence of forming these regions based on specific requirement. Subsequent to forming the guard ring 221, the second deep well 211, the well region 212, and the second heavily doped region 213, a second rapid annealing operation is performed to activate the aforementioned regions. A temperature of the second rapid annealing operation is less than the temperature in the first rapid annealing operation. In some embodiments, a temperature of the second rapid annealing operation is in a range from about 750° C. to about 850° C.

Figure 4K:
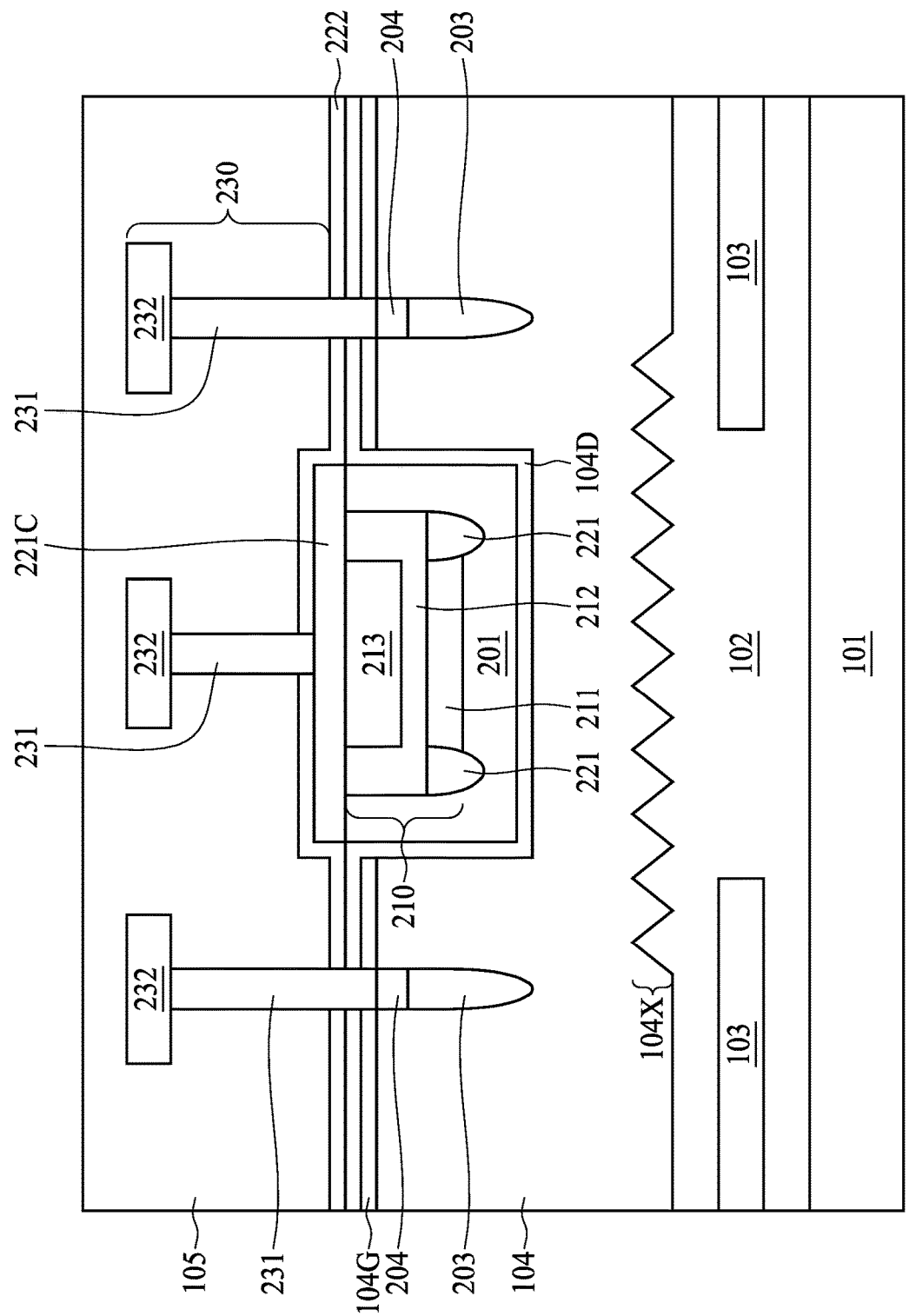

Referring to FIG. 4K, FIG. 4K is a cross sectional view of a semiconductor device during intermediate stages of manufacturing operations, according to some embodiments of the present disclosure. The third sacrificial layer 193 is removed and the protection film 222 is formed over the silicon capping layer 221C and the first surface FS of the substrate 104. In some embodiments, the protection film 222 may include oxide, or other suitable insulating material. An insulation layer 105 is formed over the protection film 222 and the substrate 104. The interconnect structure 230 including a plurality of conductive vias 231 and metal lines 232 are formed in the insulation layer 105 (the details of the interconnect structure 230 can be referred to FIG. 2A to FIG. 2B).

The embodiment(s) discussed in FIG. 5A to FIG. 7K further provides an approach of forming a multiplication zone in the substrate 104.

Figure 5A:
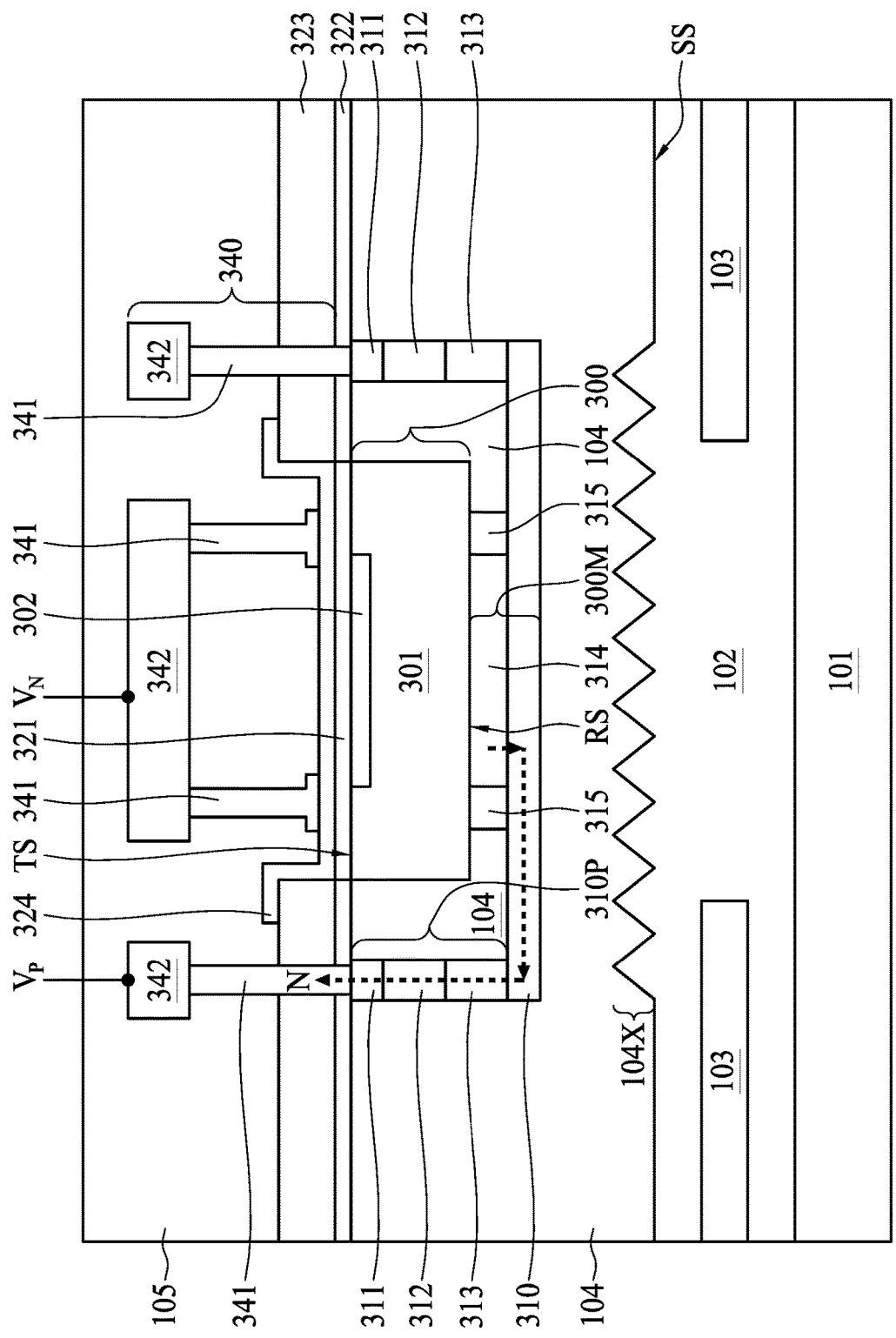
FIG. 5A is a cross sectional view of a semiconductor device, according to some embodiments of the present disclosure.

Referring to FIG. 5A, FIG. 5A is a cross sectional view of a semiconductor device, according to some embodiments of the present disclosure. The image sensor device 2 at least includes a substrate 104, one or more image sensor element 300 at a top surface of the substrate 104, and an interconnect structure 340 over the top surface of the substrate 104. The substrate 104 includes a first material, wherein the first material generates electrical signals from radiation within a first range of wavelengths; the image sensor element 300 includes a second material, wherein the second material generates electrical signals from radiation within a second range of wavelengths, and the second range is different from first range. Alternatively stated, the first material is different from the second material. The details of the substrate 104 can be referred to FIG. 2A.

The image sensor element 300 may be a single photon avalanche diode (SPAD) image sensor or at least constitute part of a SPAD image sensor, which may be able to detect photon and convert radiation into electrical signals. In some embodiments, the image sensor element 300 includes an absorption layer 301 at a first surface FS of the substrate 104. The absorption layer 301 includes second material, such as germanium or other suitable material. The image sensor device 2 may further include a multiplication zone 300M formed in the substrate 104 and at a level below the absorption layer 301. In some embodiments, the top of the multiplication zone 300M may be adjacent or proximal to a light receiving surface RS of the absorption layer 301. The multiplication zone 300M may include dopant regions or wells, which will be discussed subsequently.

In some embodiments, the image sensor device 2 may include a transparent layer 102 at a second surface SS of the substrate 104 opposite to the first surface FS, wherein the transparent layer 102 is made of a material that is transparent to radiation within the second range of wavelength or allows at least a portion of the incident radiation to traverse thereacross and reaches the absorption layer 301. In some of the embodiments, the image sensor device 2 may further include a shielding layer 103, a filter layer 101, and microstructure portion 104X. The details of the transparent layer 102, the shielding layer 103, a filter layer 101, and microstructure portion 104X can be referred to the discussion in FIG. 2A to FIG. 2B.

Figure 5B:
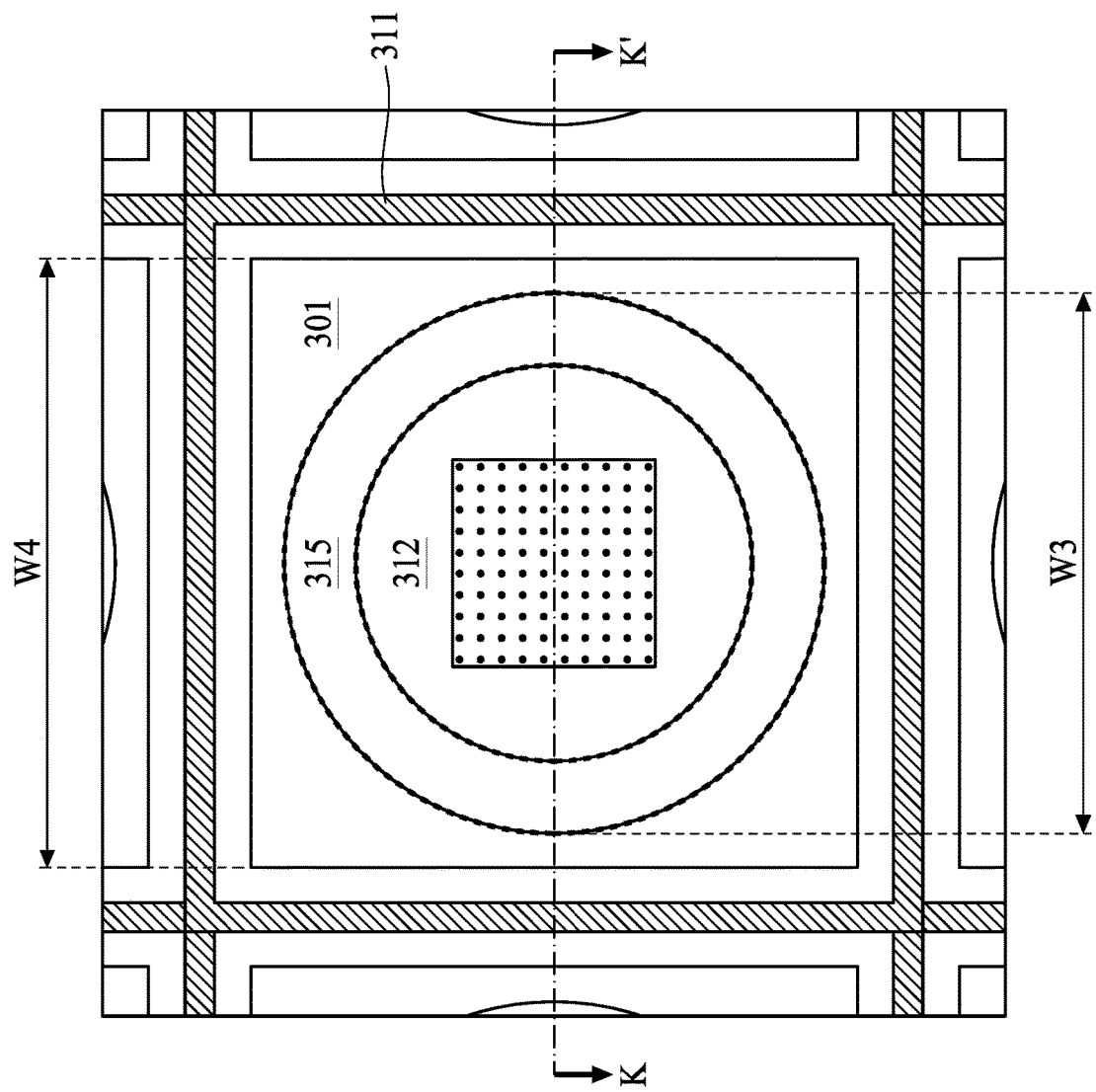
FIG. 5B is a top view of a semiconductor device, according to some embodiments of the present disclosure.

Referring to FIG. 5A and FIG. 5B, FIG. 5B is a top view of a semiconductor device, according to some embodiments of the present disclosure. It should be noted that in some of the embodiments, FIG. 5A may be a cross sectional view of a semiconductor structure along a line K-K' in FIG. 5B. Similar to the discussion in FIG. 2A to FIG. 2B, the second material (such as germanium) of the absorption layer 301 may be formed by epitaxial growth, and is formed in a recessed area of the substrate 104 in order to enhance the sensitivity of responding to radiation at NIR wavelengths and/or radiation around/higher than 1.55 μm, and further alleviating the issue of lattice mismatch or dislocation defects. In some embodiments, the signal transmitting surface TS of the image sensor element 300 (or referred as the signal transmitting surface TS of the absorption layer 301) is coplanar with the first surface FS of the substrate 104.

The substrate 104 may further include a signal transmitting dopant region 310P doped with dopant having second conductivity. For example, the second conductivity type may be N type, and the dopant, may be phosphorus, arsenic, or the like. The signal transmitting dopant region 310P may include a gradient dopant profile, such as a first portion of the signal transmitting dopant region 310P proximal to the first surface FS of the substrate 104 having a dopant concentration greater than a dopant concentration of a second portion of the signal transmitting dopant region 310P below the first portion and distal to the first surface FS of the substrate 104. For example, the signal transmitting dopant region 310P includes a first heavily doped region 311, a well region 312 below the first heavily doped region 311, and a first deep well 313 below the well region 312. In some embodiments, a concentration of dopant in the first heavily doped region 311 may be in a range from about 1e18 cm$^{-3}$ to about 1e21 cm$^{-3}$, a concentration of dopant in the well region 312 may be in a range from about 1e15 cm$^{-3}$ to about 1e18 cm$^{-3}$, and a concentration of dopant in the first deep well 313 may be in a range from about 1e15 cm$^{-3}$ to about 1e19 cm$^{-3}$.

The image sensor element 300 may further include a second heavily doped region 302 proximal to the signal transmitting surface TS of the absorption layer 301, wherein the second heavily doped region doped 302 may be doped with dopant having a first conductivity type different from the second conductivity type, such as boron (B) in the cases of first conductivity type being P type. In some embodiments, a concentration of dopant in the second heavily doped region 302 may be in a range from about 1e18 cm$^{-3}$ to about 1e21 cm$^{-3}$.

In an example provided in FIG. 5B, a shape of the image sensor element 300 (or the absorption layer 301) may be similar to quadrilateral shape from a top view perspective. However, it should be noted that the shape of the image sensor element 300 (or the absorption layer 301) from a top view perspective can also be circular or other suitable shape.

The signal transmitting dopant region 310P (including the first heavily doped region 311, the well region 312, and the first deep well 313) laterally surrounds the absorption layer 301. The signal transmitting dopant region 310P separates one absorption layer 301 from another absorption layer. In some embodiments, the bottom of the signal transmitting dopant region 310P is at a level below the light receiving surface RS of the absorption layer 301.

The image sensor device 2 further includes a multiplication zone 300M in the substrate 104 and at a level below the absorption layer 301. The multiplication zone 300M may include an implant region 314 adjacent to a bottom of the absorption layer 301, and a second deep well 310 adjacent to the implant region 314. For example, the second deep well 310 is directly below the implant region 314. In some embodiments, the second deep well 310 connects between the implant region 314 and the signal transmitting dopant region 310P, thereby forming a conductive path that guides the generated electron(s). In some embodiments, the implant region 314 is doped with dopant with first type conductivity (for example, P type), and the second deep well 310 is doped with second type conductivity. In some embodiments, a concentration of dopant in the second deep well 310 may be in a range from about 1e15 cm$^{-3}$ to about 1e19 cm$^{-3}$, and a concentration of dopant in the implant region 314 may be in a range from about 1e15 cm$^{-3}$ to about 1e18 cm$^{-3}$.

In some embodiments, the image sensor device 2 further includes a guard ring 315 laterally surrounding the implant region 314 for alleviating leakage. In some embodiments, the guard ring 315 is at a level above the second deep well 310. In some embodiments, the guard ring 315 is doped with dopant with second type conductivity (for example, N type). In some embodiments, a concentration of dopant in the guard ring 315 may be in a range from about 1e15 cm$^{-3}$ to about 1e19 cm$^{-3}$. As shown in FIG. 5B, the guard ring 315 (region between two dashed line) may have a circular donut shape or similar shapes that can laterally surrounding the implant region 314. In some embodiments, the entire guard ring 315 may be within a coverage of a vertical projection area of the absorption layer 301. A width W3 of the guard ring 315 is less than a width W4 of the absorption layer 301.

Figure 5C:
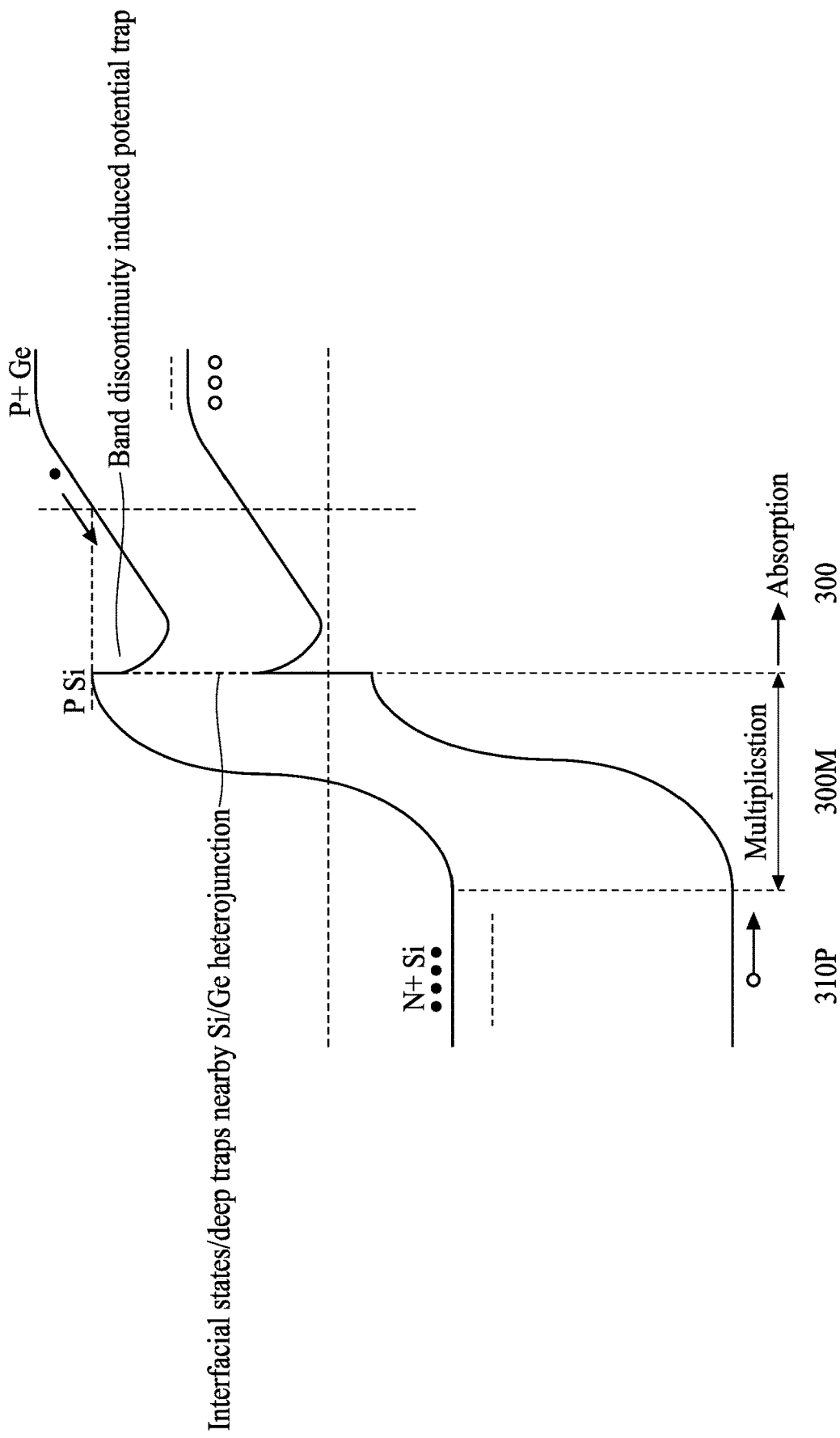
FIG. 5C shows a band diagram of the semiconductor device discussed in FIG. 5A to FIG. 5B, according to some embodiments of the present disclosure.

Referring to FIG. 5A to FIG. 5C, FIG. 5C shows a band diagram of the semiconductor device discussed in FIG. 5A to FIG. 5B, according to some embodiments of the present disclosure. The dopant profile as discussed in FIG. 5A is configured to be able trigger avalanche effect. For example, the image sensor element 300 absorbs incident photon from light receiving surface RS, and the junction interface between two regions doped with different conductivity types of dopant could help trigger avalanche effect. The dopant profile of the implant region 314 and the second deep well 310 of the multiplication zone 300M may trigger avalanche effect and generate sufficient intensity of electrical signal. Specifically, interfacial states forms deep traps nearby a silicon/germanium heterojunction, and the band discontinuity induces potential trap. The signal transmitting dopant region 310P is configured to guide the generated electrical signal to the interconnect structure 340.

In some embodiments, the image sensor device 2 further includes a silicon capping layer 321 covering a signal transmitting surface TS of the absorption layer 301. The image sensor device 2 may further include a dielectric layer 322 covering the first surface FS of the substrate 104 and surrounding the silicon capping layer 321. In some embodiments, the dielectric layer 322 may include undoped silicate glass (USG) layer or other suitable material. The image sensor device 2 may further including a spacer layer 323 over the dielectric layer 322, wherein the spacer layer 323 may include insulation material. At least a portion of the silicon capping layer 321 is free from being covered by the spacer layer 323. The image sensor device 2 may further include a thin film 324 over the silicon capping layer 321, and in some embodiments, the thin film 324 may extend over the sidewall and/or a top surface of the spacer 323. In some embodiments, the thin film 324 may include silicon, or other suitable material, and the interconnect structure 340 is in direct contact with a top surface of the thin film 324.

The image sensor device 2 further includes an insulation layer 105 over the spacer layer 323 and the image sensor element 300, wherein the interconnect structure 340 is disposed in the insulation layer 105. The interconnect structure 340 may include conductive vias 341 and metal lines 342, wherein one or more of the conductive vias 341 penetrate the spacer layer 323 and the dielectric layer 322 and is electrically connected to the signal transmitting dopant region 310P. As discussed above, one of the paths of electrons from the multiplication zone 300M to the interconnect structure 340 is presented as arrow N in FIG. 5A. In some of the embodiments, one or more of the conductive vias 341 is electrically coupled to the image sensor element 300. The operation voltage may be applied through the interconnect structure 340. For example, the absorption layer 301 is applied with first bias voltage $V_N$ and the signal transmitting dopant region 310P is connected to second bias voltage $V_P$. In some embodiments, first bias voltage $V_N$ is in a range from about 0V to about 20V, and second bias voltage $V_P$ is about 0V, however the present disclosure is not limited thereto. In some embodiments, an operation voltage of the image sensor device 2 can be lowered (for example to 10V) due to the advantage of this configuration.

Figure 6:
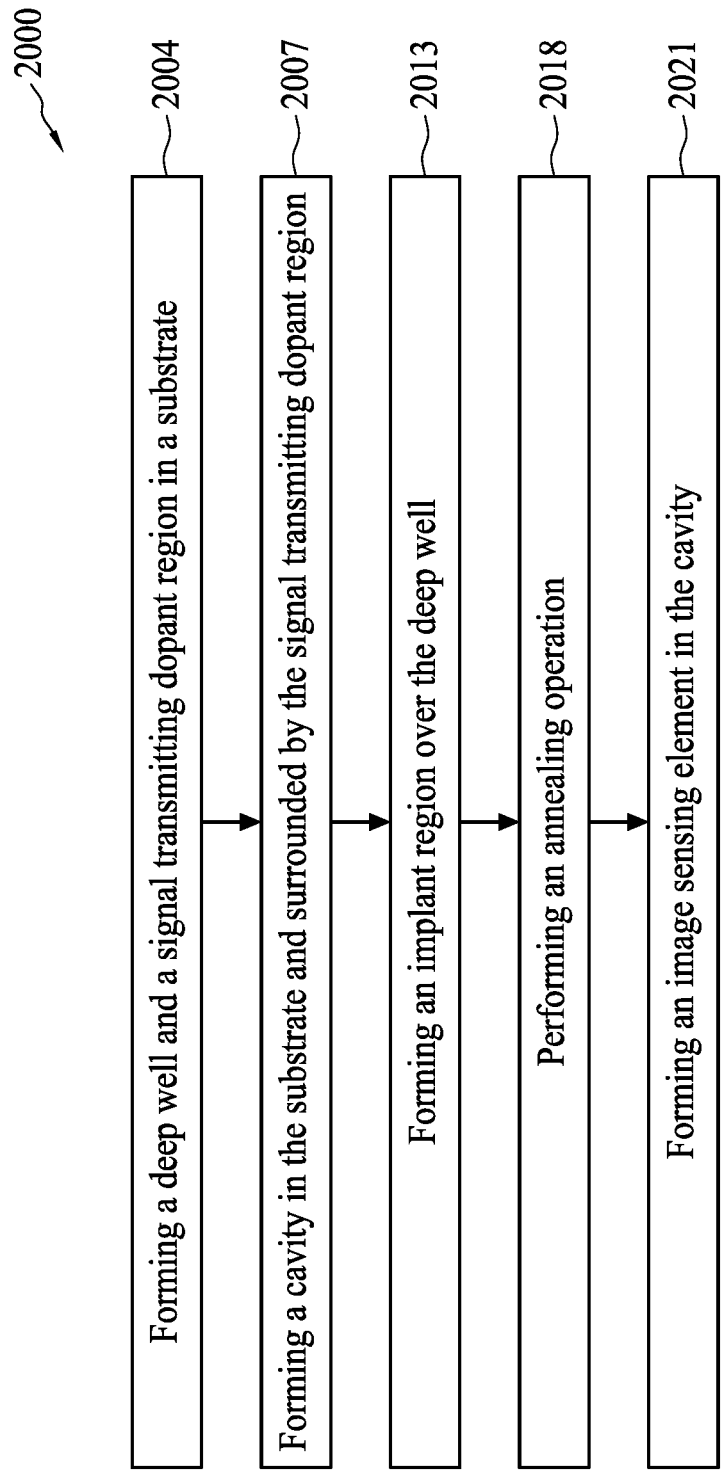
FIG. 6 shows a flow chart describing a method for fabricating a semiconductor device, in accordance with some embodiments of the present disclosure.

Referring to FIG. 6, FIG. 6 shows a flow chart describing a method for fabricating a semiconductor device, in accordance with some embodiments of the present disclosure. The method 2000 for fabricating the image sensor device 2 includes forming a deep well and a signal transmitting dopant region in a substrate (operation 2004, which can be referred to FIG. 7B), forming a cavity in the substrate and surrounded by the signal transmitting dopant region (operation 2007, which can be referred to FIG. 7D), forming an implant region over the deep well (operation 2013, which can be referred to FIG. 7F), performing an annealing operation (operation 2018, which can be referred to FIG. 7F), and forming an image sensing element in the cavity (operation 2021, which can be referred to FIG. 7H).

Figure 7A:
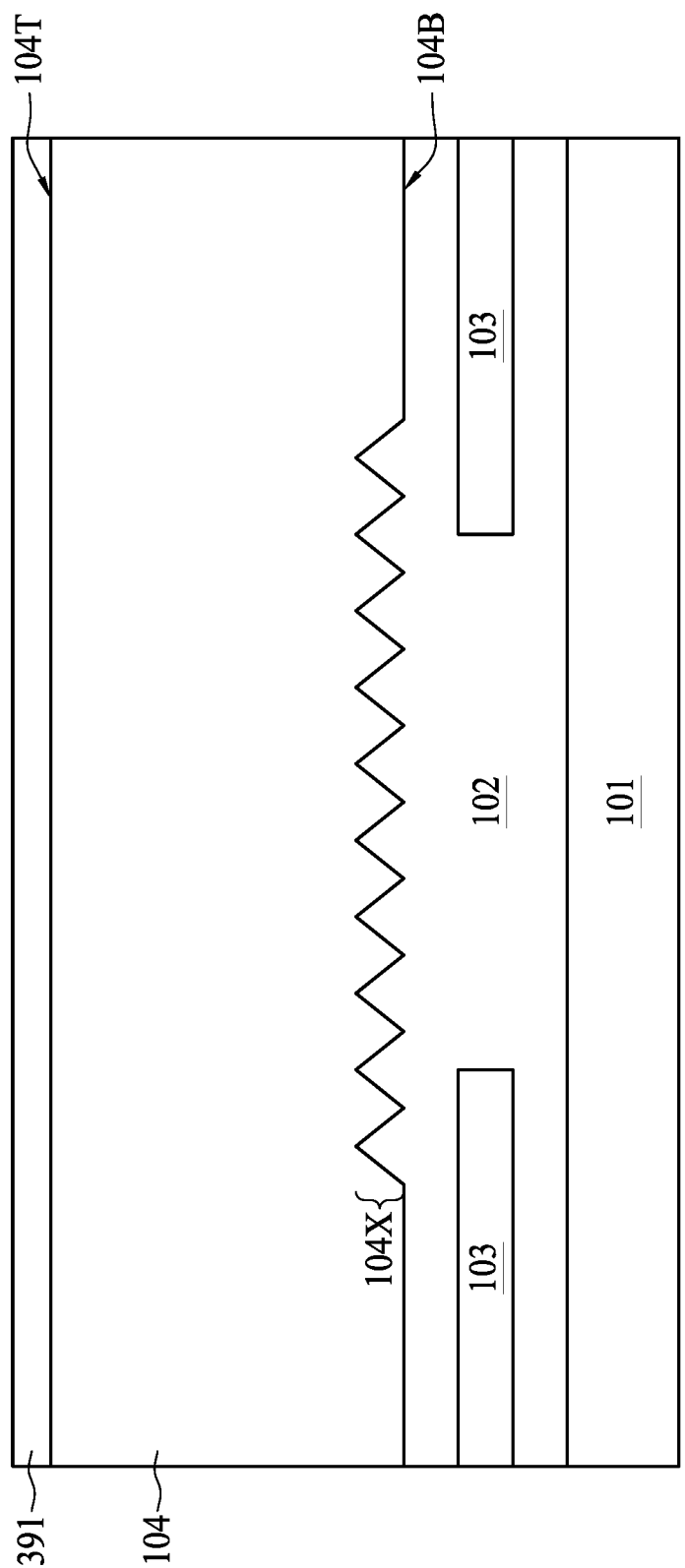
FIG. 7A to FIG. 7K are cross sectional views of a semiconductor device during intermediate stages of manufacturing operations, according to some embodiments of the present disclosure.

Referring to FIG. 7A, FIG. 7A is a cross sectional view of a semiconductor device during intermediate stages of manufacturing operations, according to some embodiments of the present disclosure. A substrate 104 including first material is provided, wherein the details of the substrate 104 can be referred to the discussion in FIG. 2A or FIG. 5A. In some embodiments, the first material may include silicon. A transparent layer 102 is formed over a back surface 104B of the substrate 104, wherein the transparent layer 102 is made of a material that allows at least a portion of the incident radiation to traverse thereacross. In some embodiments, a shielding layer 103 is formed to define sensing area. The shielding layer 103 may be disposed in the transparent layer 102, or alternatively, attached to or overlapping with the transparent layer 102. A filter layer 101 may be formed over a back surface of the transparent layer 102 opposite to the substrate 104. In some embodiments, a microstructure portion 104X may be formed at an interface between the transparent layer 102 and the substrate 104 (The details with regard to the microstructure portion 104X can be referred to FIG. 2A). A first sacrificial layer 391 is formed over a top surface 104T of the substrate 104. In some embodiments, the first sacrificial layer 391 may include oxide. In some embodiments, the first sacrificial layer 391 may be patterned.

Figure 7B:
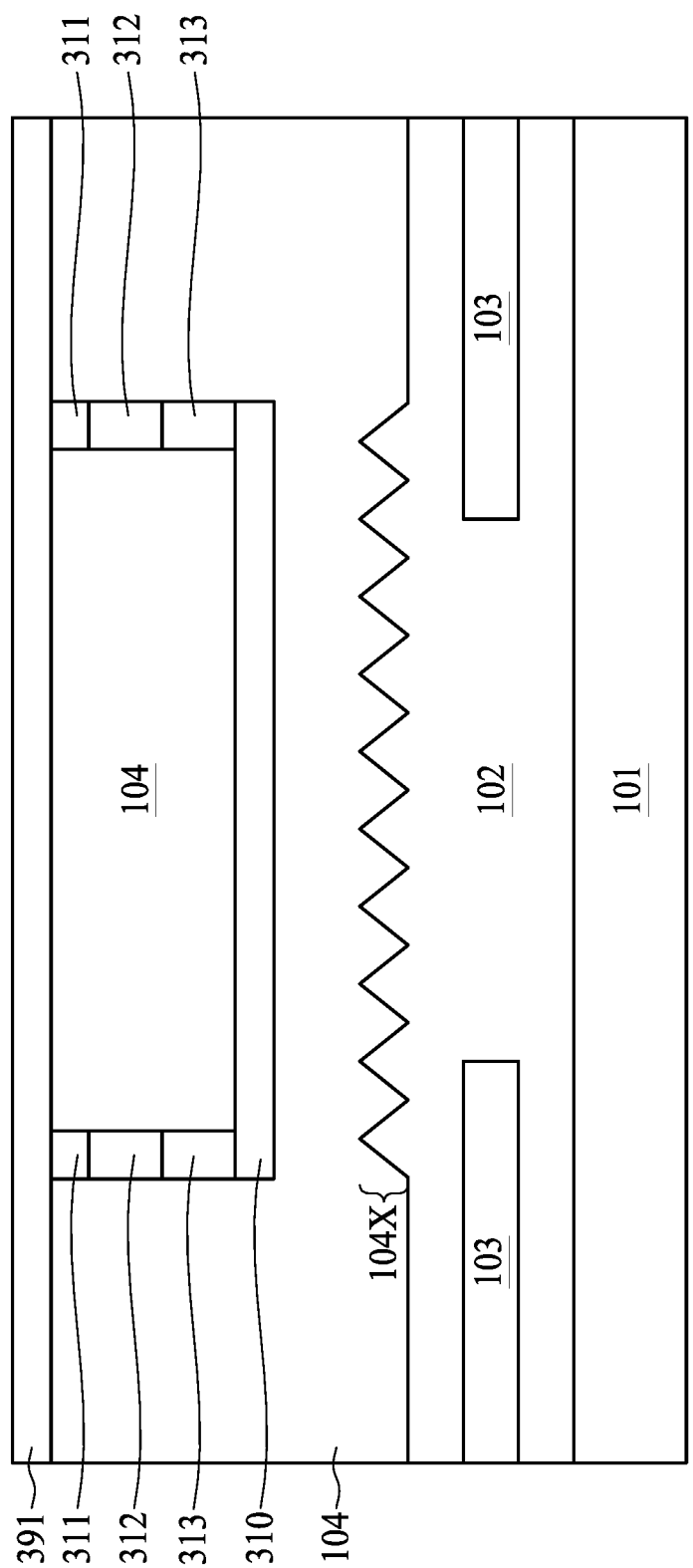

Referring to FIG. 7B, FIG. 7B is a cross sectional view of a semiconductor device during intermediate stages of manufacturing operations, according to some embodiments of the present disclosure. A second deep well 310 is formed in the substrate 104. The second deep well 310 is doped with dopant having second conductivity type (in the case of second conductivity type being N type, the dopant may be phosphorus, arsenic, or the like). In some embodiments, a concentration of dopant in the second deep well 310 may be in a range from about 1e15 $cm^{-3}$ to about 1e19 $cm^{-3}$, and a doping profile depth of the second deep well 310 is in a range from about 0.01 μm to about 3 μm.

A signal transmitting dopant region 310P is formed in the substrate 104 and above a peripheral area of the second deep well 310. In some embodiments, the signal transmitting dopant region 310P may be formed by multi-step doping operation. For example, the signal transmitting dopant region 310P may be formed by a first step of doping second conductivity type dopant having a depth in a range from about 0.01 μm to about 3 μm with a concentration in a range from about 1e15 $cm^{-3}$ to about 1e19 $cm^{-3}$, followed by a second step of doping second conductivity type dopant having a depth in a range from about 0.01 μm to about 1 μm with a concentration in a range from about 1e15 $cm^{-3}$ to about 1e18 $cm^{-3}$, and followed by a third step of doping second conductivity type dopant having a depth in a range from about 0.01 μm to about 0.1 μm with a concentration in a range from about 1e18 $cm^{-3}$ to about 1e21 $cm^{-3}$. Thereby, the signal transmitting dopant region 310P may have a gradient dopant profile that can be configured to guide electrons, for example, such as including the first heavily doped region 311, the well region 312, and the first deep well 313 as discussed in FIG. 5A. In some embodiments, a dopant concentration of an upper portion of the signal transmitting dopant region 310P is greater than a dopant concentration of a lower portion of the signal transmitting dopant region 310P. In some embodiments, the second deep well 310 is formed prior to the formation of the signal transmitting dopant region 310P, but in some alternative embodiments, the second deep well 310 can be formed after the formation of signal transmitting dopant region 310P.

Figure 7C:
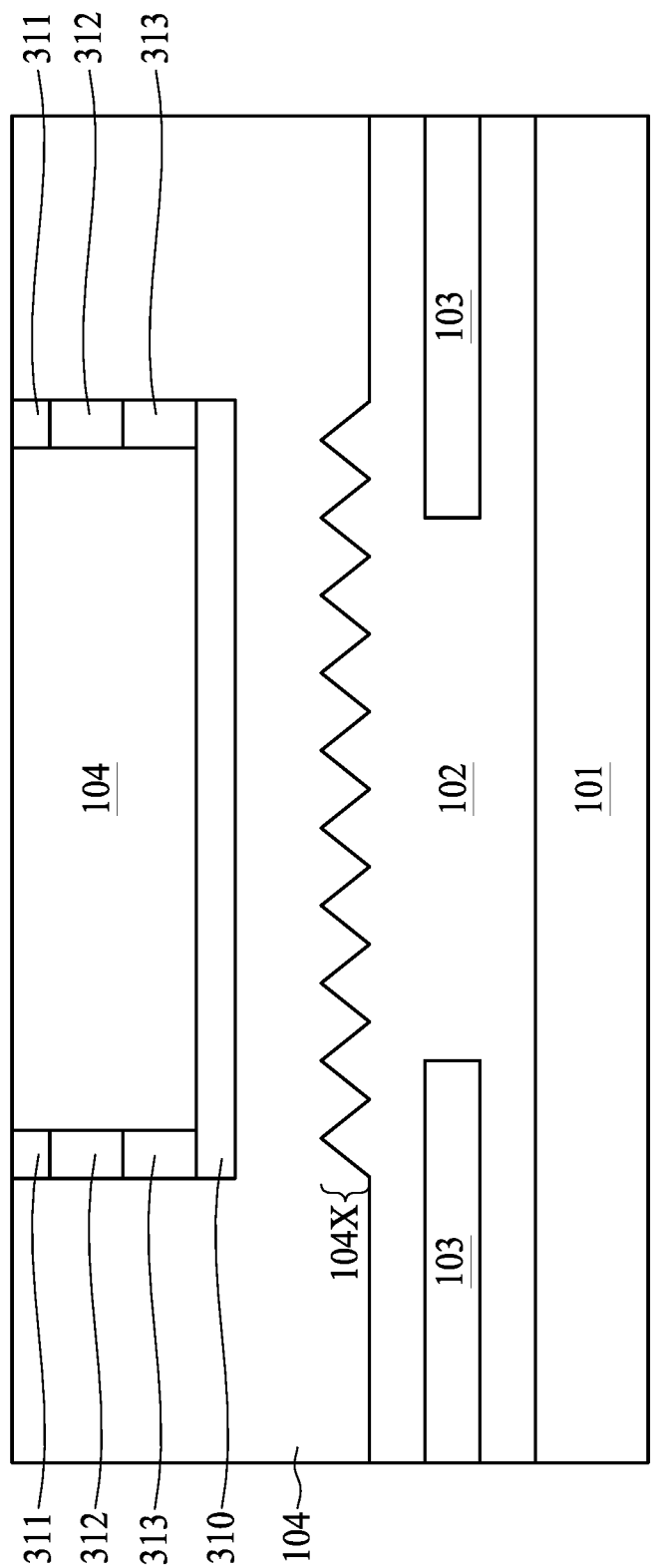

Referring to FIG. 7C, FIG. 7C is a cross sectional view of a semiconductor device during intermediate stages of manufacturing operations, according to some embodiments of the present disclosure. The first sacrificial layer 391 is removed after the formation of the second deep well 310 and the signal transmitting dopant region 310P.

Figure 7D:
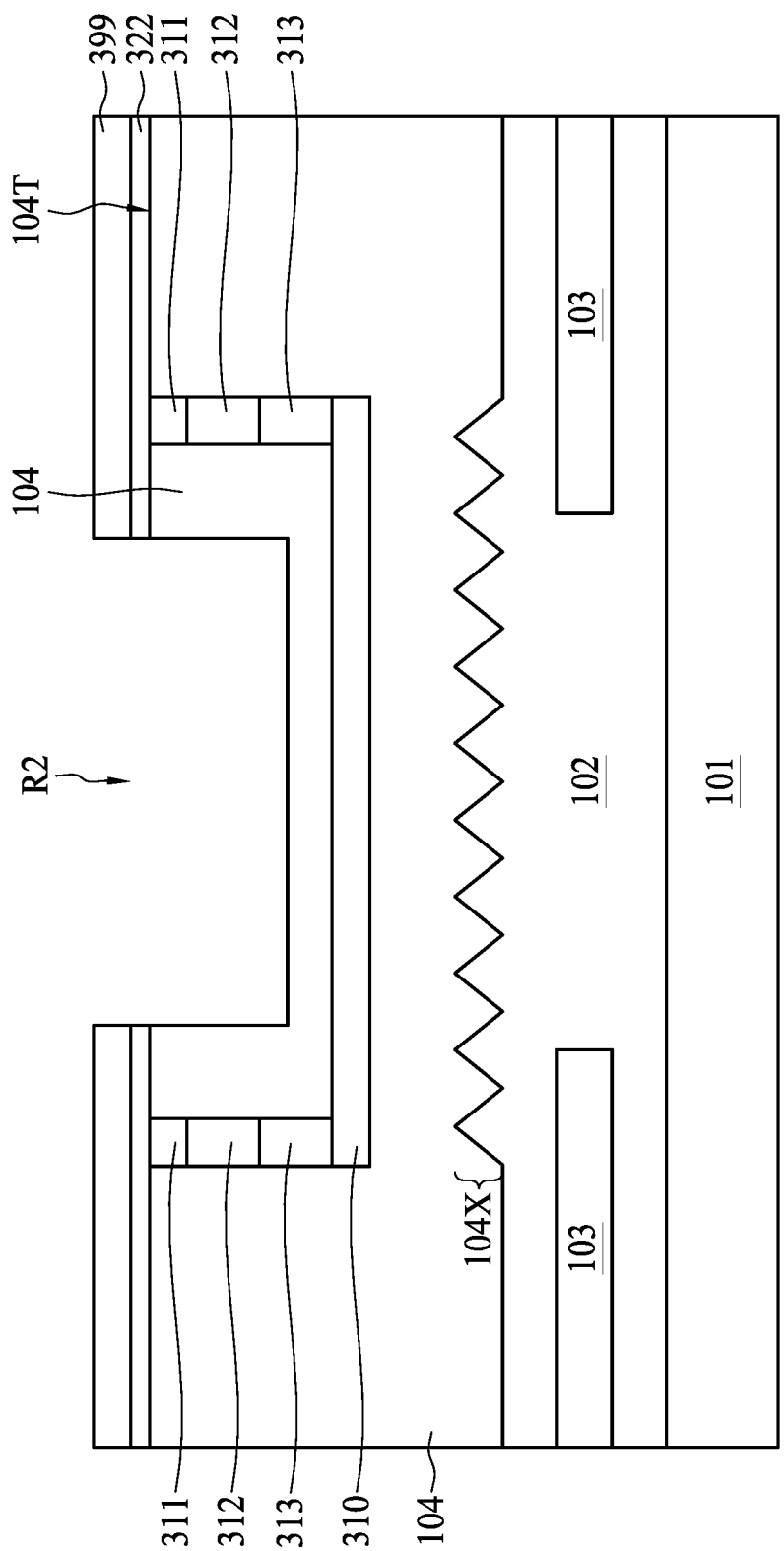

Referring to FIG. 7D, FIG. 7D is a cross sectional view of a semiconductor device during intermediate stages of manufacturing operations, according to some embodiments of the present disclosure. A dielectric layer 322 is formed at the top surface 104T of the substrate 104. In some embodiments, the dielectric layer 322 include undoped silicate glass (USG) layer. A photoresist layer 399 is formed and patterned over the dielectric layer 322. A photolithography operation is performed to form a cavity R2 at the top surface 104T of the substrate 104. Similar to the discussion in FIG. 5B, in some embodiments, the shape of the cavity R2 may be similar to quadrilateral shape from a top view perspective. The cavity R2 is at a position laterally surrounded by the signal transmitting dopant region 310P. In some embodiments, a substantially undoped portion of the substrate 104 is between a bottom of the cavity R2 and the second deep well 310. The photoresist layer 199 is removed subsequently.

Figure 7E:
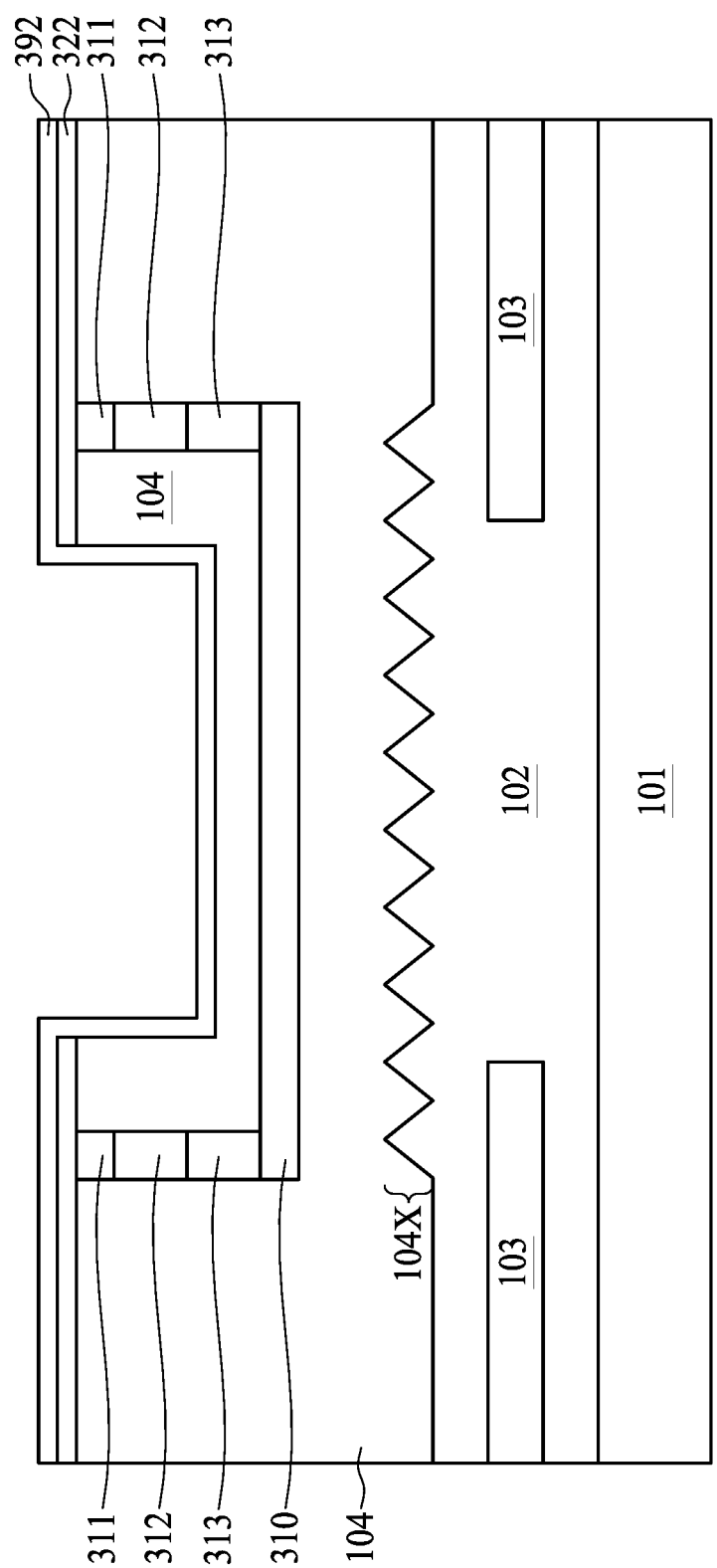

Referring to FIG. 7E, FIG. 7E is a cross sectional view of a semiconductor device during intermediate stages of manufacturing operations, according to some embodiments of the present disclosure. A second sacrificial layer 392 conforming the sidewall and the bottom of the cavity R2 is formed by deposition operation. The second sacrificial layer 392 may further extend over a top surface of the dielectric layer 322. In some embodiments, the second sacrificial layer 392 may include oxide. In some of the embodiments, the second sacrificial layer 392 may be patterned.

Figure 7F:
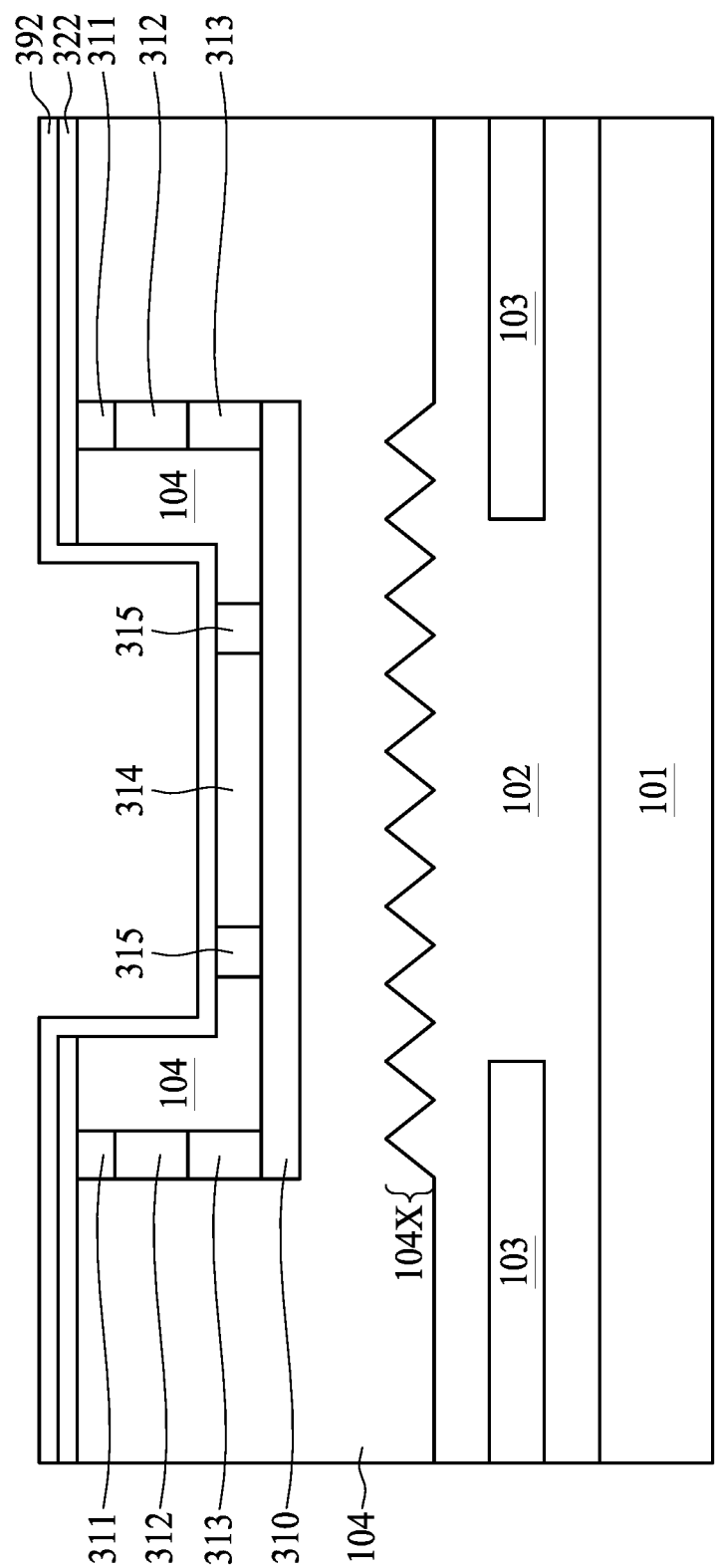

Referring to FIG. 7F, FIG. 7F is a cross sectional view of a semiconductor device during intermediate stages of manufacturing operations, according to some embodiments of the present disclosure. A guard ring 315 is formed at a position between the bottom of the cavity R2 and a top of the second deep well 310. The guard ring 315 laterally surrounds a substantially undoped portion of the substrate 104. The guard ring 315 is doped with dopant having second conductivity type (in the case of second conductivity type being N type, the dopant may be phosphorus, arsenic, or the like). In some embodiments, a concentration of dopant in the guard ring 315 may be in a range from about 1e15 $cm^{-3}$ to about 1e17 $cm^{-3}$, and a doping profile depth of the guard ring 315 is in a range from about 0.1 μm to about 1 μm.

The implant region 314 is formed at a position surrounded by the guard ring 315 and between the bottom of the cavity R2 and the second deep well 310. The implant region 314 by doping the dopant having first conductivity type (in the case of first conductivity type being P type, the dopant may be boron, or the like). In some embodiments, a concentration of dopant in the implant region 314 may be in a range from about 1e15 $cm^{-3}$ to about 1e18 $cm^{-3}$, and a doping profile depth of the implant region 314 is in a range from about 0.1 μm to about 1 μm. In some embodiments, a rapid annealing operation is performed to activate the implant region 314. A temperature of the rapid annealing operation is in a range from about 750° C. to about 850° C.

Figure 7G:
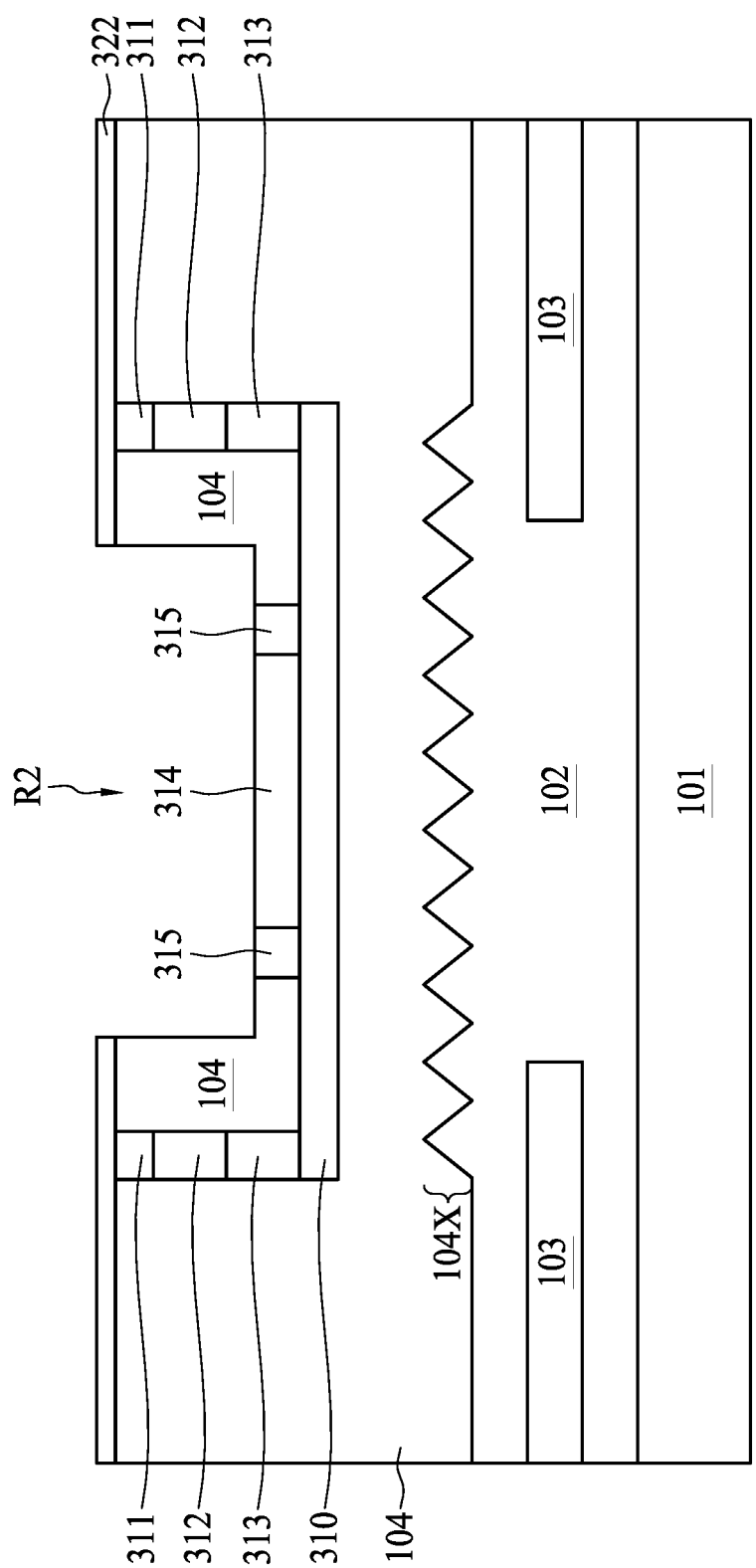
Figure 7H:
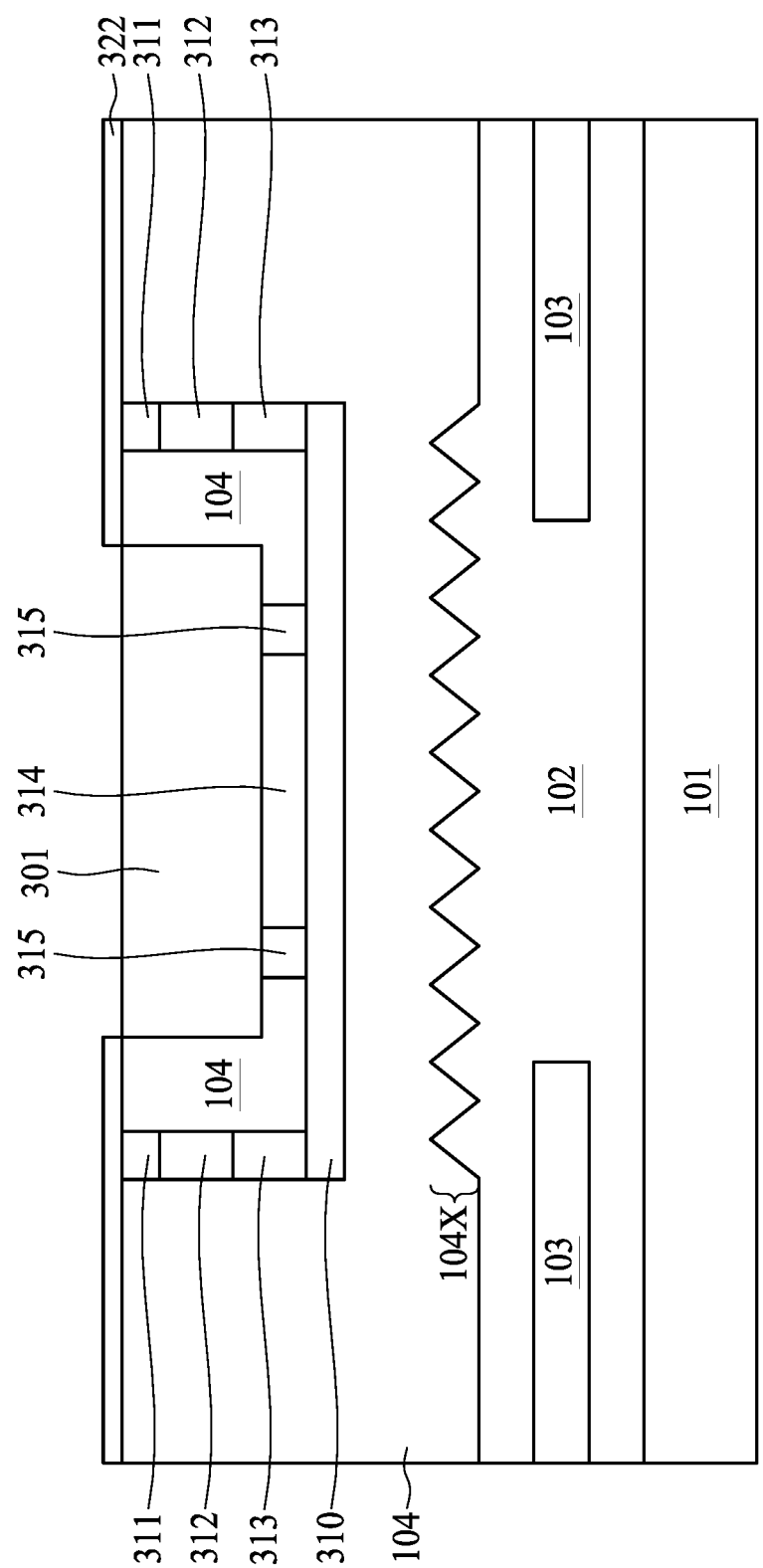

Referring to FIG. 7G, FIG. 7G is a cross sectional view of a semiconductor device during intermediate stages of manufacturing operations, according to some embodiments of the present disclosure. The second sacrificial layer 392 is removed. Referring to FIG. 7H, FIG. 7H is a cross sectional view of a semiconductor device during intermediate stages of manufacturing operations, according to some embodiments of the present disclosure. A second material is formed in the cavity R2 (shown in FIG. 7G) by deposition operation, wherein the second material generates electrical signals from radiation within a second range of wavelengths, and the second range is different from first range. In some embodiments, the second material may be germanium or other suitable material. In some embodiments, the deposition of the second material may include epitaxial growth. A chemical mechanical planarization operation can be performed to remove excessive portion of the second material to form the absorption layer 301. In some of the embodiments, the second material has a top surface coplanar with the dielectric layer 322 after the chemical mechanical planarization operation. A cleaning operation may be performed and a portion of the second material may be removed from the top, thus the top surface of absorption layer 301 can be substantially leveled with a top surface of the substrate 104.

Figure 7I:
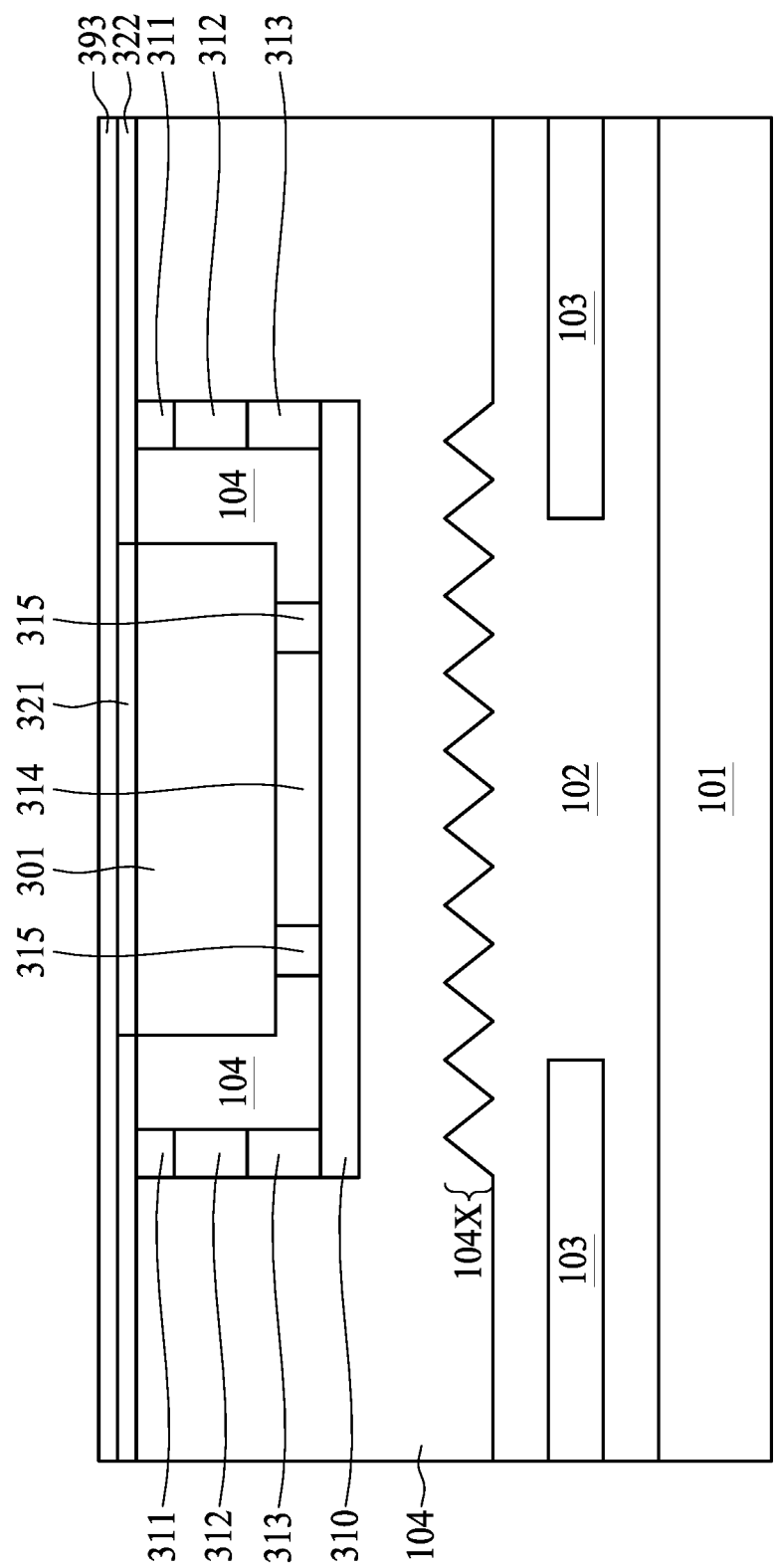

Referring to FIG. 7I, FIG. 7I is a cross sectional view of a semiconductor device during intermediate stages of manufacturing operations, according to some embodiments of the present disclosure. A silicon capping layer 321 is formed over the absorption layer 301. In some cases, the silicon capping layer 321 may have a top surface coplanar with the dielectric layer 322. A third sacrificial layer 393 is formed over the dielectric layer 322 and the silicon capping layer 321. In some embodiments, the third sacrificial layer 393 may include oxide. In some of the embodiments, the third sacrificial layer 393 may be patterned.

Figure 7J:
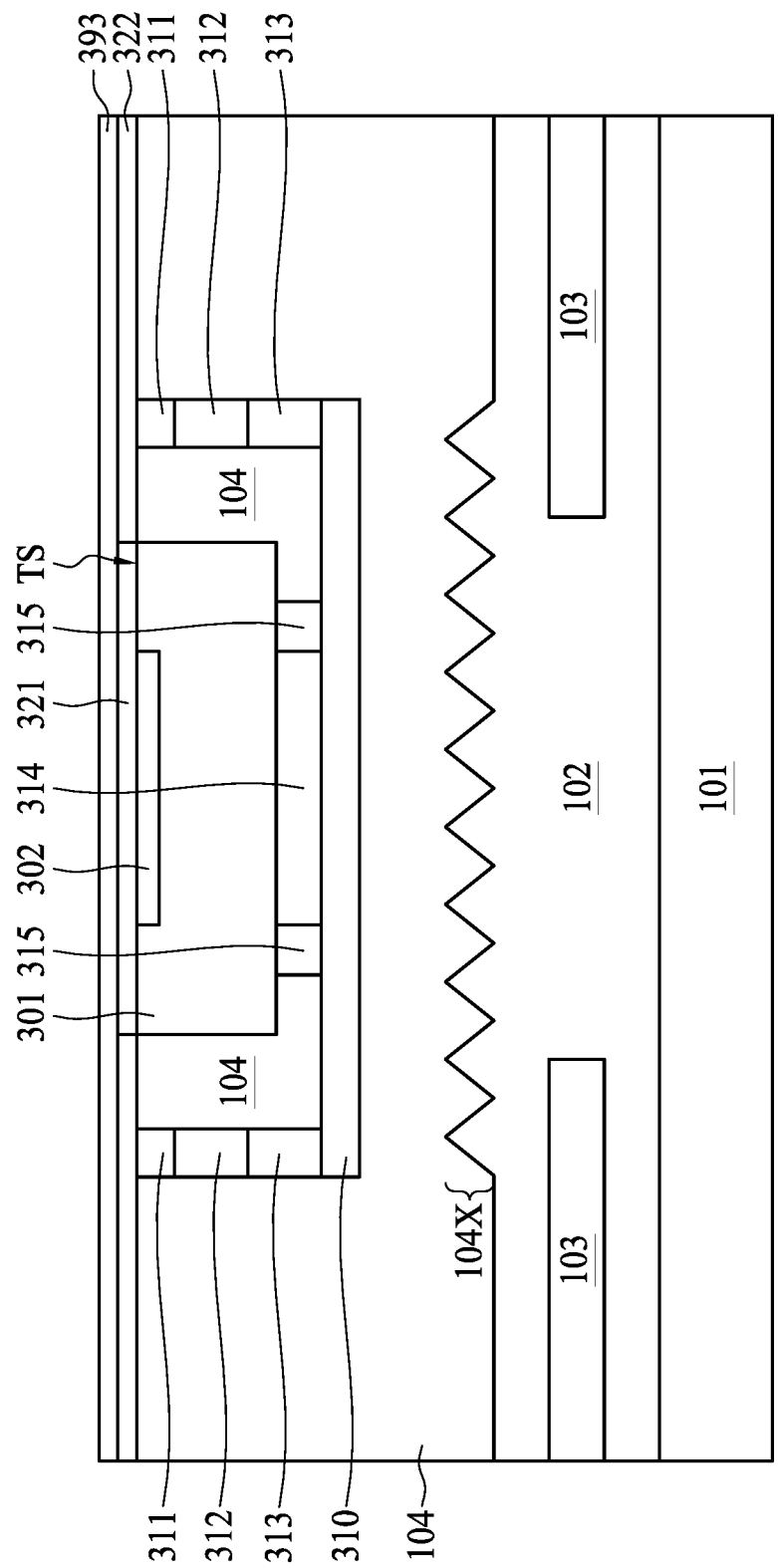

Referring to FIG. 7J, FIG. 7J is a cross sectional view of a semiconductor device during intermediate stages of manufacturing operations, according to some embodiments of the present disclosure. The second heavily doped region doped 302 is formed at the signal transmitting surface TS (top surface as shown in FIG. 7J) of the absorption layer 301, wherein the second heavily doped region doped 302 may be doped with dopant having a first conductivity type different from the second conductivity type, such as boron (B) in the cases of first conductivity type being P type. In some embodiments, a concentration of dopant in the second heavily doped region 302 may be in a range from about 1e18 cm$^{-3}$ to about 1e21 cm$^{-3}$, and a doping profile depth of the second heavily doped region 302 is in a range from about 0.01 μm to about 0.1 μm.

Figure 7K:
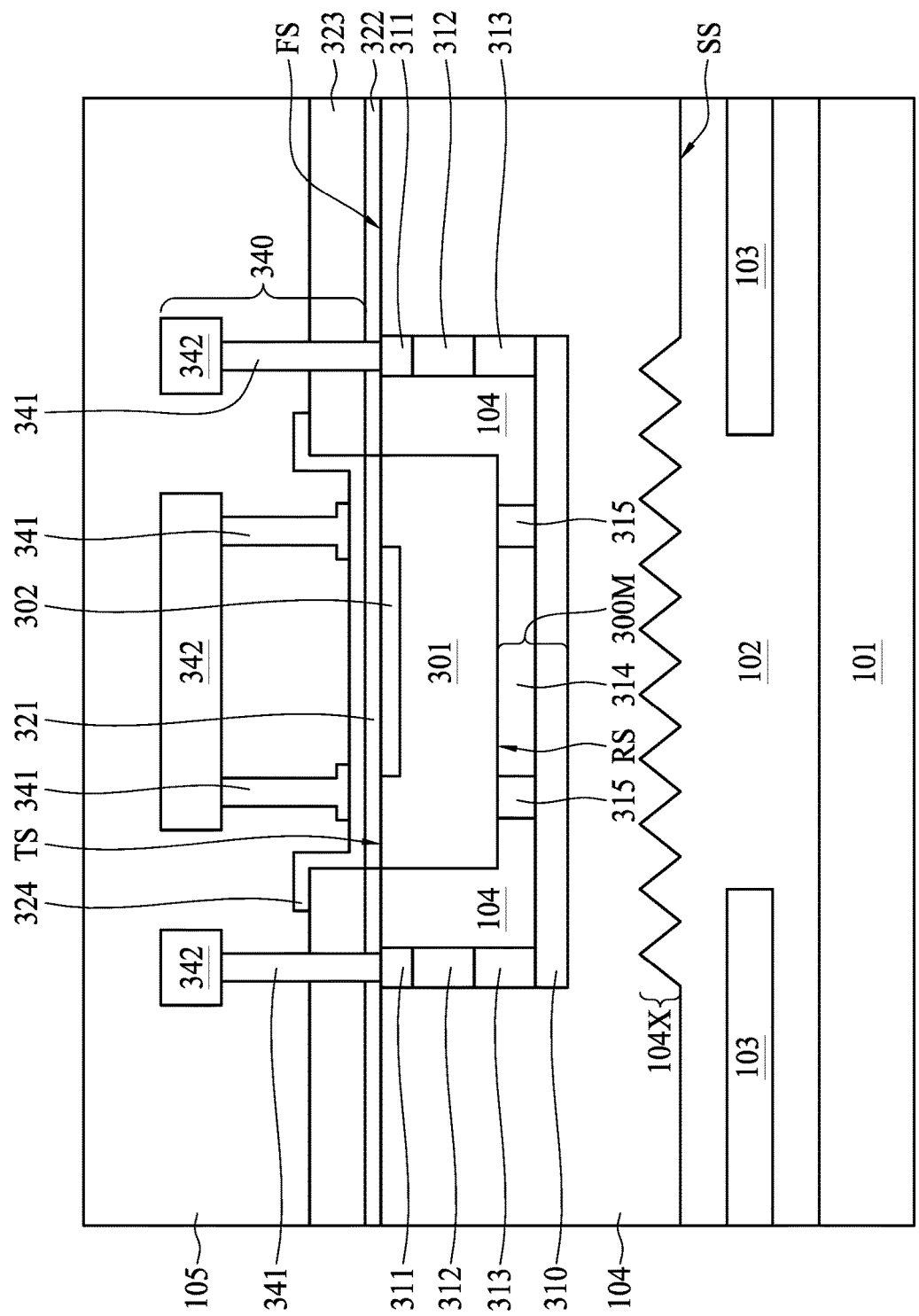

Referring to FIG. 7K, FIG. 7K is a cross sectional view of a semiconductor device during intermediate stages of manufacturing operations, according to some embodiments of the present disclosure. The third sacrificial layer 393 is removed. The spacer 323 is formed over the dielectric layer 322, and a thin film 324 is formed over the silicon capping layer 321, and in some embodiments, the thin film 324 may further extend over the sidewall and/or a top surface of the spacer 323. An insulation layer 105 is formed over the spacer 323 acid thin film 324. The interconnect structure 340 including a plurality of conductive vias 341 and metal lines 342 are formed in the insulation layer 105 (the details of the interconnect structure 340 can be referred to FIG. 5A to FIG. 5B).

Similar to previous discussion, although the first conductivity type being P type and the second conductivity type being N type is used as an example in FIG. 5A to FIG. 7K, it should be noted that first conductivity type can be N type and the second conductivity type can be P type in the image sensor device 2, which can be utilized as hole sensing device instead.

The embodiment(s) discussed in FIG. 8A to FIG. 10D provides an approach similar to FIG. 2A to FIG. 4K, however, the difference resides in that the first deep well and the first heavily doped region laterally surrounding the multiplication layer is formed in the absorption layer. For the purpose of simplicity, hereinafter the elements in FIG. 8A to FIG. 10D labeled with same number as FIG. 2A to FIG. 4K or FIG. 5A to FIG. 7K would not be repeatedly described. The details of similar elements can be referred to the above discussion and FIG. 2A to FIG. 4K or FIG. 5A to FIG. 7K.

Figure 8A:
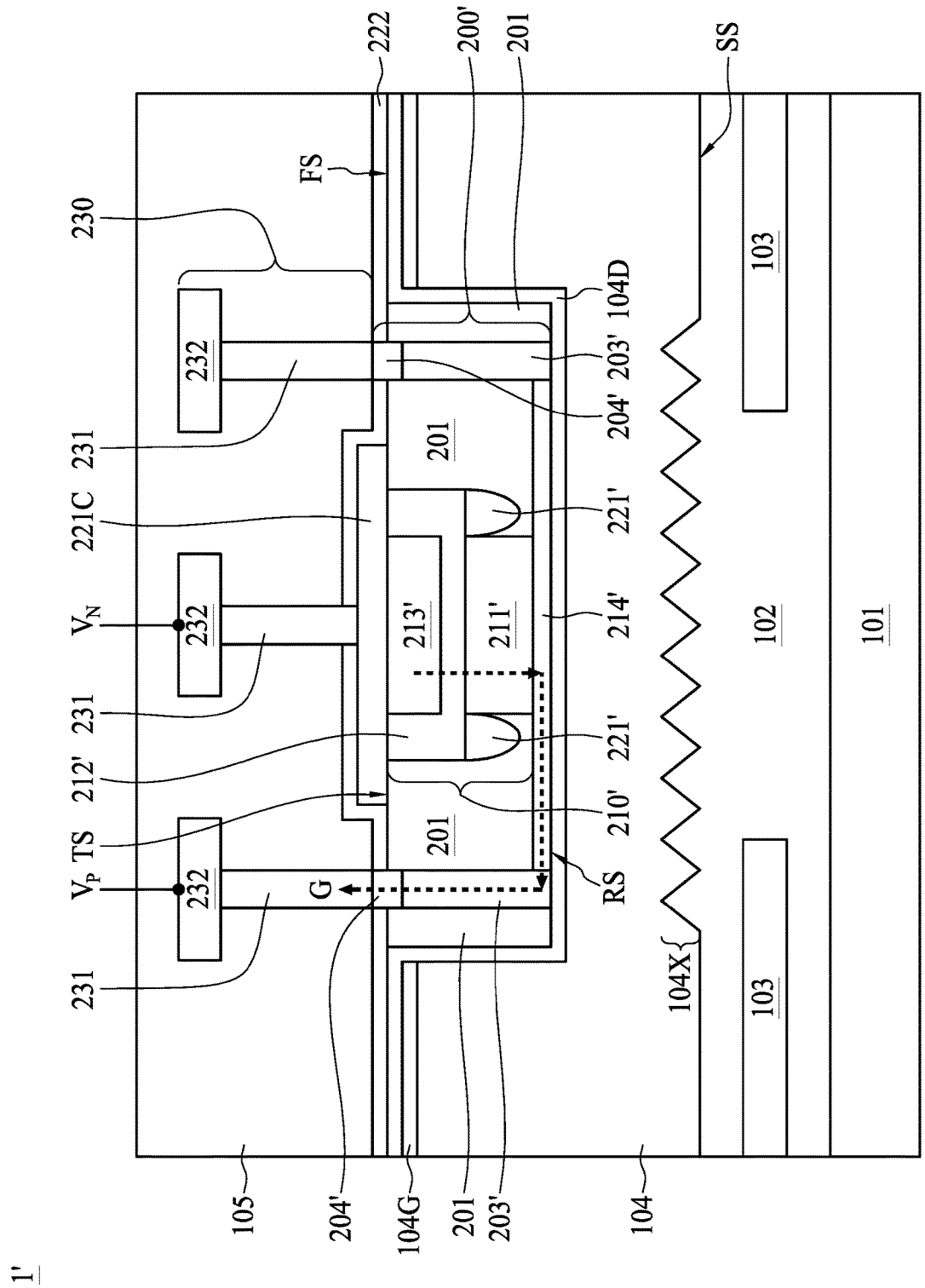
FIG. 8A is a cross sectional view of a semiconductor device, according to some embodiments of the present disclosure.
Figure 8B:
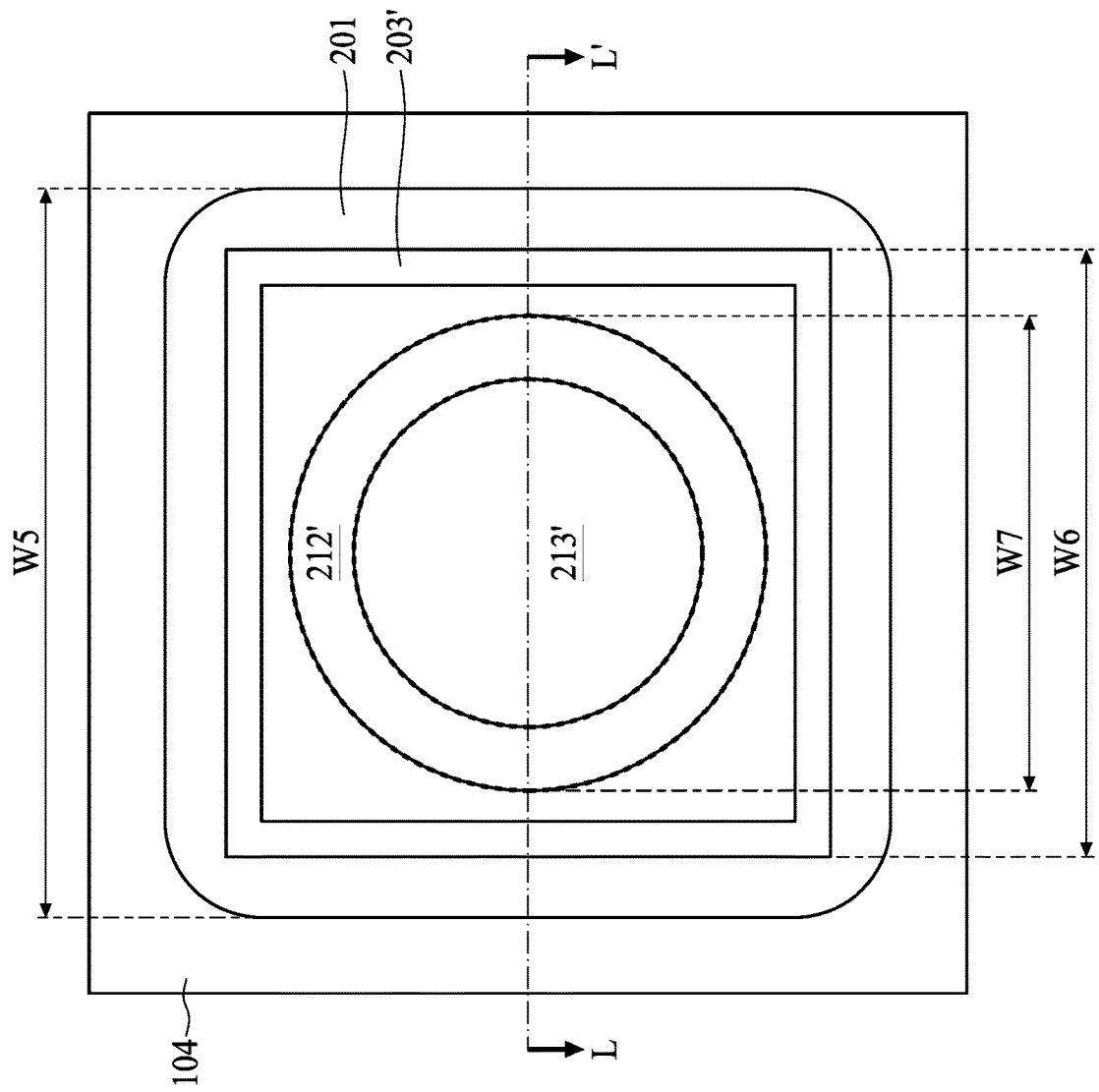
FIG. 8B is a top view of a semiconductor device, according to some embodiments of the present disclosure.

Referring to FIG. 8A and FIG. 8B, FIG. 8A is a cross sectional view of a semiconductor device and FIG. 8B is a top view of a semiconductor device, according to some embodiments of the present disclosure. FIG. 8A may be a cross sectional view of a semiconductor structure along a line L-L' in FIG. 8B. The image sensor device 1' includes a substrate 104 and one or more image sensor element 200', which may include an absorption layer 201 made of second material (such as germanium) and formed in a recessed region of the substrate 104. The image sensor device 1' further includes an interconnect structure 230 over a signal transmitting surface TS of the image sensor element 200'.

In some embodiments, the substrate 104 further includes an interfacial layer 104D over the first surface FS of the substrate 104 and conforming a surface of the recessed portion of the substrate 104. The interfacial layer 104D may be doped with dopant having first conductivity type. For example, the first conductivity type may be P type and the dopant may be boron (B). In some embodiments, a concentration of dopant in the interfacial layer 104D is in a range from about 1e16 cm$^{-3}$ to about 1e18 cm$^{-3}$. In some embodiments, the interfacial layer 104D can be configured to guide away leakage current. In some of the embodiments, the interfacial layer 104D may have a surface that is suitable for epitaxial growth and thereby further alleviating the issue of lattice mismatch. In some embodiments, the signal transmitting surface TS of the image sensor element 200' (or referred as the signal transmitting surface TS of the absorption layer 201') is coplanar with the first surface FS of the substrate 104.

In an example provided in FIG. 8B, a shape of the image sensor element 200' (or the absorption layer 201) may be similar to quadrilateral shape from a top view perspective. However, it should be noted that alternatively the shape of the image sensor element 200' (or the absorption layer 201) from a top view perspective can also be circular or other suitable shape.

In some embodiments, each of the image sensor element 200' is formed with a first heavily doped region 204', wherein the first heavily doped region 204' may surround a portion of the absorption layer 201. In some embodiments, the first heavily doped region 204' may have a quadrangle annular shape or circular annular shape from a top view perspective, or other suitable shape that laterally surrounds or at least partially and laterally surrounds a portion of the absorption layer 201. The first heavily doped region 204' may be doped with dopant having first conductivity type, such as boron (B) in the cases of first conductivity type being P type. In some embodiments, a concentration of dopant in the first heavily doped region 204' may be in a range from about 1e18 cm$^{-3}$ to about 1e21 cm$^{-3}$. The image sensor device 1' may further include a first deep well 203' under the first heavily doped region 204' in a vertical direction and laterally surrounding a portion of the absorption layer 201. In some embodiments, a shape of the first deep well 203' from a top view perspective may be aligned with or substantially in accordance with the first heavily doped region 204', but the present disclosure is not limited thereto. A distance between the first deep well 203' and the second surface SS of the substrate 104 is less than a distance between the first heavily doped region 204' and the second surface SS of the substrate 104. The first deep well 203' may be doped with dopant having first conductivity type. In some embodiments, a concentration of dopant in the first deep well 203' may be in a range from about 1e15 cm$^{-3}$ to about 1e17 cm$^{-3}$. In some embodiments, the first deep well 203' may be formed by multi-step doping operation with different depths. In some embodiments, a bottom of the first deep well 203' may be proximal to or leveled with a top surface of the interfacial layer 104D over a bottom of the recessed region of the substrate 104.

A multiplication zone 210' is formed in the absorption layer 201. In some embodiments, the multiplication zone 210' is formed at a position laterally or partially surrounded by the first deep well 203' and/or the first heavily doped region 204'. Photoelectrons may drift into the multiplication zone and can trigger avalanche effect. The avalanche effect occurs at heterojunction interface between two (or more) implant regions with different conductivity type, for example, at a heterojunction between P type region and N type region. Therefore, the multiplication zone 210' is configured to have a dopant profile that is suitable for triggering avalanche effect and guiding the generated carriers.

In some embodiments, the multiplication zone 210' includes a second heavily doped region 213' proximal to the signal transmitting surface TS of the absorption layer 201, a well region 212' below the second heavily doped region 213', and a second deep well 211' below the well region 212'. In some embodiments, a portion of the well region 212' is proximal to the signal transmitting surface TS of the absorption layer 201 and laterally surrounding the second heavily doped region 213'. In some of the embodiments, the entire second deep well 211' is within a coverage of a vertical projection area of the well region 212'.

The image sensor device 1' further includes a third deep well 214' connecting between the second deep well 211' and the first deep well 203'. For example, the third deep well 214' is directly below the second deep well 211'. The third deep well 214' may be electrically connected to a side (or alternatively, a bottom) of the first deep well 203', thereby forming a conductive path that guides the generated electron (s). The third deep well 214' is doped with second type conductivity (in the case of second conductivity type being N type, the dopant may be phosphorus, arsenic, or the like). In some embodiments, a concentration of dopant in the third deep well 214' may be in a range from about 1e15 cm$^{-3}$ to about 1e19 cm$^{-3}$. One of the paths of electrons from the multiplication zone 210' to the interconnect structure 230 is presented as arrow G in FIG. 8A.

In some embodiments, the image sensor element 200' further includes a guard ring 221' in the absorption layer 201, positioned below the well region 212' and laterally surrounding the second deep well 211'. In some embodiments, a bottom of the second deep well 211' is at a level below a bottom of the guard ring 221'. In some embodiments, the guard ring 221' is doped with dopant having second conductivity type (in the case of second conductivity type being N type, the dopant may be phosphorus, arsenic, or the like). In some embodiments, a concentration of dopant in the guard ring 221' may be in a range from about 1e15 cm$^{-3}$ to about 1e17 cm$^{-3}$. The guard ring 221' may alleviate the issue of leakage current. In some of the embodiments, an outer edge of the guard ring 221' may be aligned with an outer edge of the well region 212', but the present disclosure is not limited thereto.

In some embodiments, the second heavily doped region 213' is doped with dopant having second conductivity type different from the first conductivity type. For example, the second conductivity type may be N type, and the dopant may be phosphorus, arsenic, or the like. In some embodiments, a concentration of dopant in the second heavily doped region 213' may be in a range from about 1e18 cm$^{-3}$ to about 1e21 cm$^{-3}$.

In some embodiments, the well region 212' is doped with dopant having second conductivity type (in the case of second conductivity type being N type, the dopant may be phosphorus, arsenic, or the like). In some embodiments, a concentration of dopant in the well region 212' may be in a range from about 1e15 cm$^{-3}$ to about 1e18 cm$^{-3}$.

In some embodiments, the second deep well 211' is doped with dopant having first conductivity type (in the case of first conductivity type being P type, the dopant may be boron, or the like). In some embodiments, a concentration of dopant in the second deep well 211' may be in a range from about 1e15 cm$^{-3}$ to about 1e18 cm$^{-3}$. The interface between the well region 212' (doped with second conductivity type) and the second deep well 211' (doped with first conductivity type) is in the absorption layer 201.

As shown in FIG. 8B, a width W5 of the absorption layer 201 is greater than a width W6 of the first deep well 203'. In some embodiments, the width W6 of the first deep well 203' is greater than a width W7 of the well region 212'. In the alternative case of the first deep well 203' having a circular shape from top view perspective, the width W6 of the first deep well 203' may be referred to as diameter or certain dimension of the first deep well 203'.

The operation voltage may be applied through the interconnect structure 230. For example, the multiplication zone 210' is applied with first bias voltage $V_N$ and the first heavily doped region 204' is connected to second bias voltage $V_P$. In some embodiments, first bias voltage $V_N$ is in a range from about 0V to about 20V, and second bias voltage $V_P$ is about 0V, however the present disclosure is not limited thereto. In some embodiments, an operation voltage of the image sensor device 1' can be lowered (for example to 10V) due to the advantage of this configuration.

Figure 9:
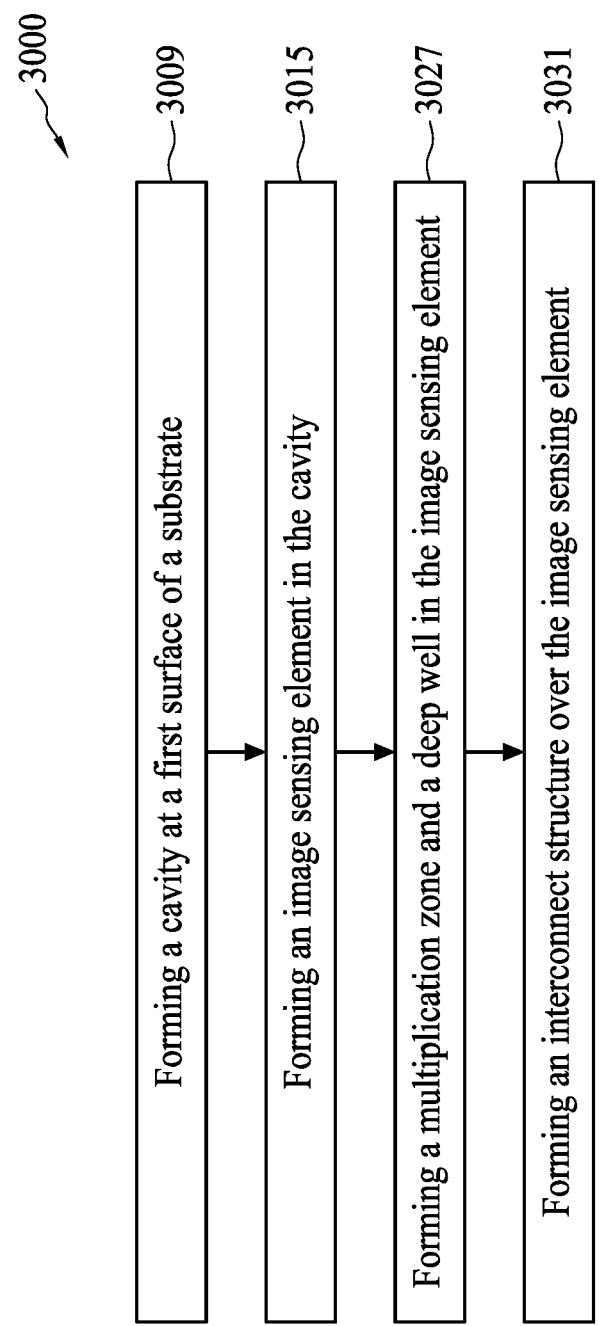
FIG. 9 shows a flow chart describing a method for fabricating a semiconductor device, in accordance with some embodiments of the present disclosure.

Referring to FIG. 9, FIG. 9 shows a flow chart describing a method for fabricating a semiconductor device, in accordance with some embodiments of the present disclosure. The method 3000 for fabricating the image sensor device 1' includes forming a cavity at a first surface of a substrate (operation 3009, which can be referred to FIG. 10A), forming an image sensing element in the cavity (operation 3015, which can be referred to FIG. 10B), forming a multiplication zone and a deep well in the image sensing element (operation 3027, which can be referred to FIG. 10D), and forming an interconnect structure over the image sensing element (operation 3031, which can be referred to FIG. 10D).

Figure 10A:
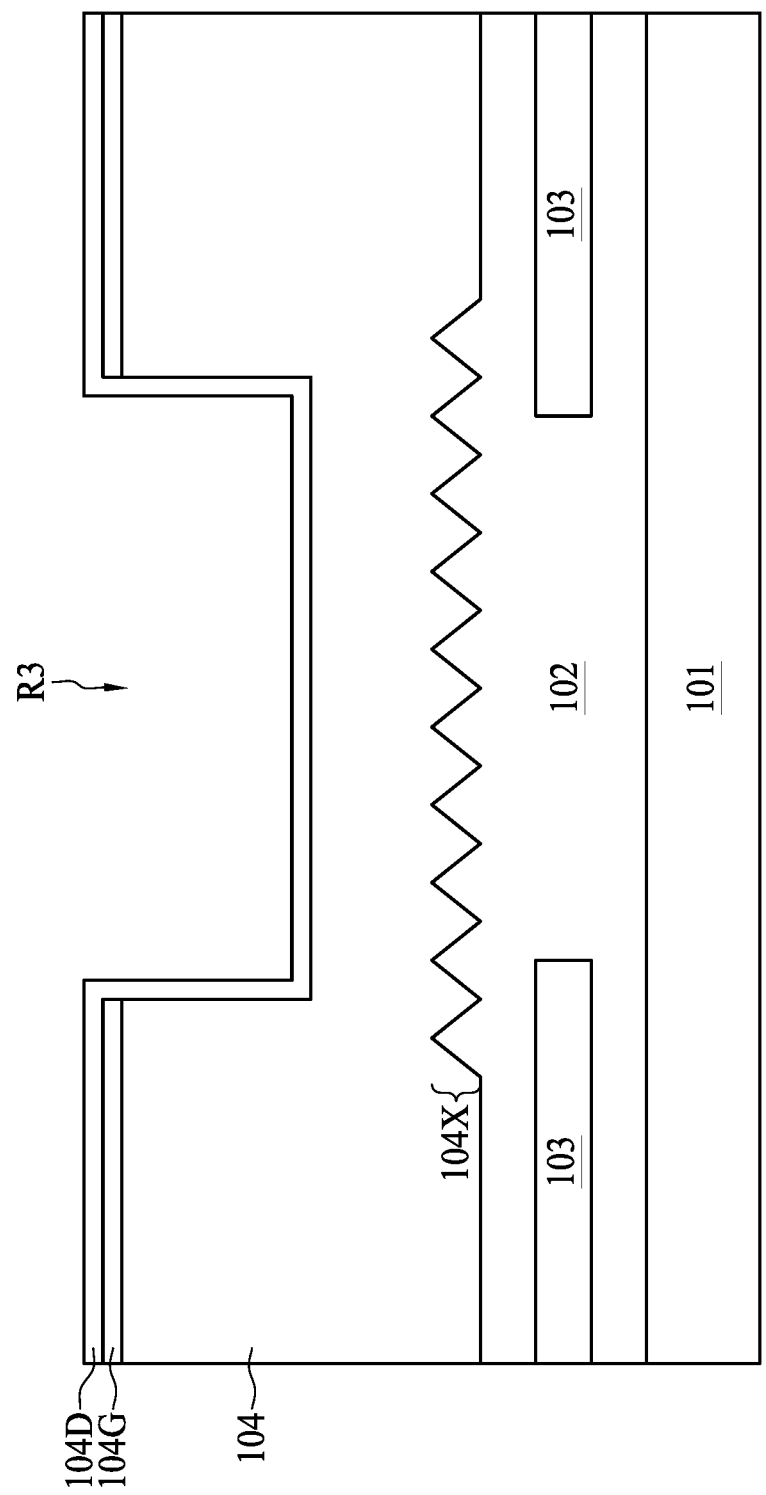
FIG. 10A to FIG. 10D are cross sectional views of a semiconductor device during intermediate stages of manufacturing operations, according to some embodiments of the present disclosure.

Referring to FIG. 10A, FIG. 10A is a cross sectional view of a semiconductor device during intermediate stages of manufacturing operations, according to some embodiments of the present disclosure. A cavity R3 is formed in the substrate 104. The details of steps through forming the cavity in the substrate 104 can be referred to FIG. 4A to FIG. 4D, however, one of differences resides in that the first deep well 203 and the first heavily doped region 204 described in FIG. 4A to FIG. 4D may not be formed in the embodiments in FIG. 10A to FIG. 10D prior to forming absorption layer 201.

Subsequently, an interfacial layer 104D is formed at the surface of the cavity R3 and the top surface of the substrate 104 (or at the top surface of the dielectric layer 104G). The details of formation of the interfacial layer 104D can be referred to FIG. 4E to FIG. 4G. In some embodiments, a concentration of dopant in the interfacial layer 104D may be in a range from about 1e16 $cm^{-3}$ to about 1e18 $cm^{-3}$, and a doping profile depth of the interfacial layer 104D may be in a range from about 0.01 μm to about 0.1 μm. As discussed in FIG. 4F, the formation of the interfacial layer 104D may include performing a first rapid annealing operation, wherein a temperature of the first rapid annealing operation is in a range from about 1000° C. to about 1100° C.

Figure 10B:
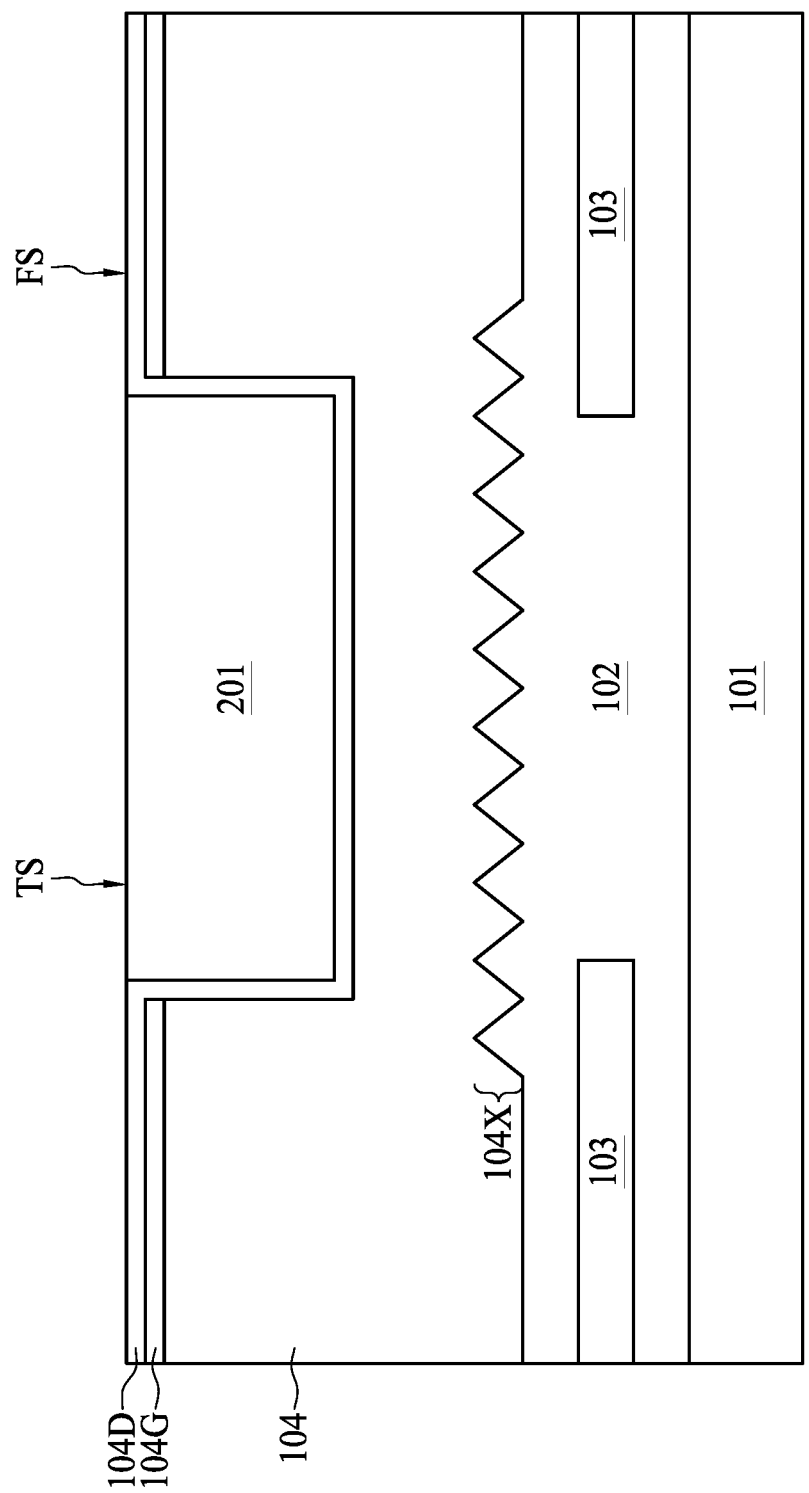

Referring to FIG. 10B, FIG. 10B is a cross sectional view of a semiconductor device during intermediate stages of manufacturing operations, according to some embodiments of the present disclosure. A second material is formed in the cavity R3 (shown in FIG. 10A) by deposition operation, wherein the second material generates electrical signals from radiation within a second range of wavelengths, and the second range is different from first range. In some embodiments, the second material may be germanium or other suitable material. In some embodiments, the deposition of the second material may include epitaxial growth. A chemical mechanical planarization operation is performed to remove excessive portion of the second material to form the absorption layer 201. In some embodiments, the signal transmitting surface TS of the absorption layer 201 may be coplanar with the first surface FS of the substrate 104 (alternatively, coplanar to the interfacial layer 104D of the substrate 104 or the dielectric layer 104G of the substrate 104). The details of forming the absorption layer 201 may be referred to FIG. 4H.

Figure 10C:
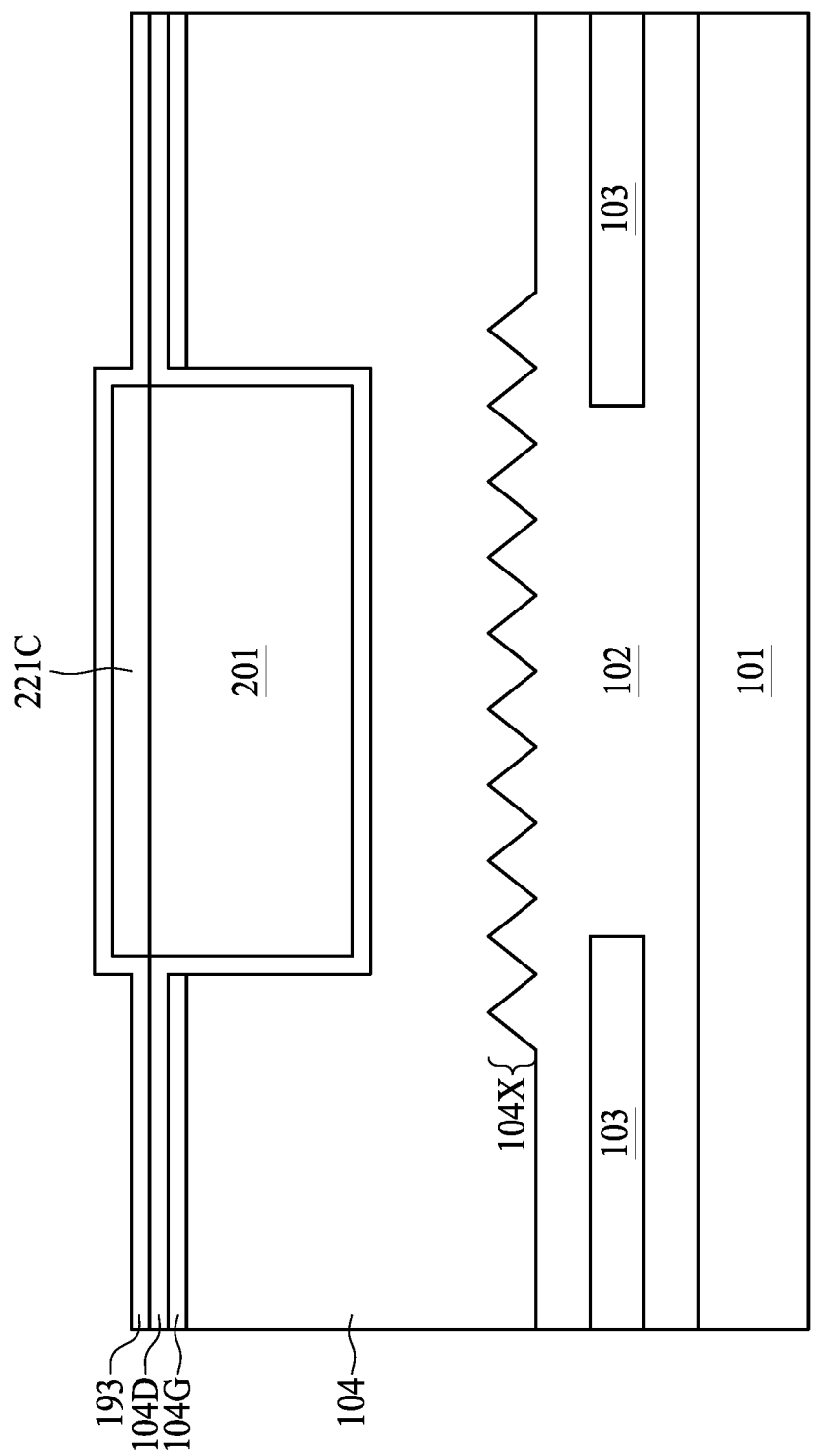

Referring to FIG. 10C, FIG. 10C is a cross sectional view of a semiconductor device during intermediate stages of manufacturing operations, according to some embodiments of the present disclosure. A silicon capping layer 221C is formed over the exposed surface of the absorption layer 201, and a sacrificial layer 193 is formed over the silicon capping layer 221C and the top surface of the substrate 104. In some embodiments, the sacrificial layer 193 may include oxide, or other suitable material. In some embodiments, the sacrificial layer 193 may be patterned. The details can be referred to FIG. 4I.

Figure 10D:
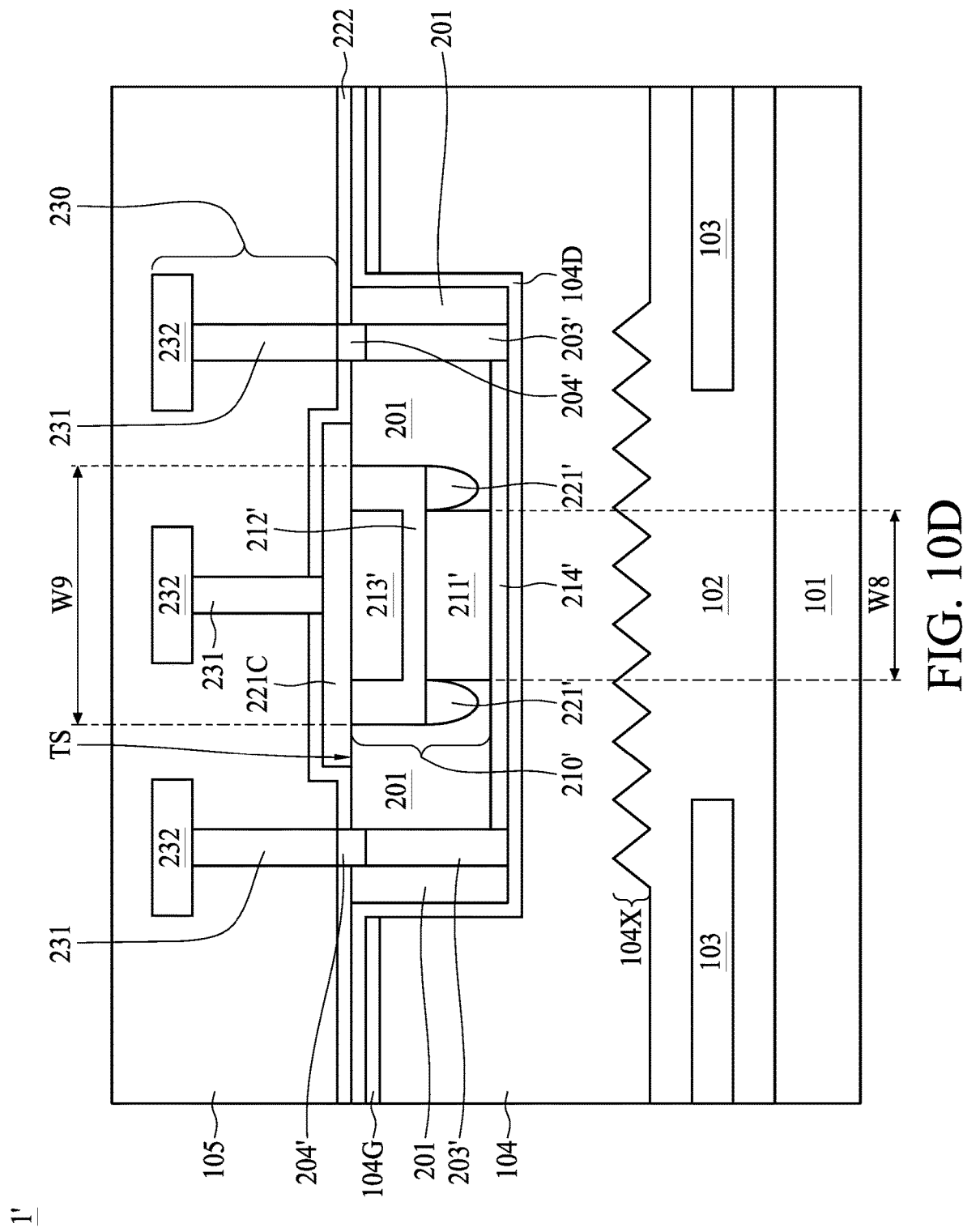

Referring to FIG. 10D, FIG. 10D is a cross sectional view of a semiconductor device during intermediate stages of manufacturing operations, according to some embodiments of the present disclosure. A series of implantation is performed when the sacrificial layer 193 is remained over the top surface 104T of the substrate 104. The third deep well 214' doped with second type conductivity (in the case of second conductivity type being N type, the dopant may be phosphorus, arsenic, or the like) is formed in the absorption layer 201 by implantation operation. In some embodiments, a concentration of dopant in the third deep well 214' may be in a range from about 1e15 $cm^{-3}$ to about 1e19 $cm^{-3}$, with a doping profile depth in a range from about 0.1 μm to about 3 μm.

A first heavily doped region 204' and a first deep well 203' is formed in the absorption layer 201 by implantation operation when the sacrificial layer 193 is remained over the top surface 104T of the substrate 104. In some embodiments, the first heavily doped region 204' and the first deep well 203' are doped with dopant having first conductivity type. In the case of the first conductivity type being P type, the dopant may be boron (B). In some embodiments, the first deep well 203' may be formed by multi-step doping operation. For example, the first deep well 203' may be formed by a first step of doping first conductivity type dopant with a doping profile depth in a range from about 0.1 μm to about 3 μm and with a concentration in a range from about 1e15 $cm^{-3}$ to about 1e17 $cm^{-3}$, followed by a second step of doping first conductivity type dopant having a doping profile depth in a range from about 0.1 μm to about 1 μm with a concentration in a range from about 1e15 $cm^{-3}$ to about 1e17 $cm^{-3}$. In some embodiments, a concentration of dopant in the first heavily doped region 204' may be in a range from about 1e18 $cm^{-3}$ to about 1e21 $cm^{-3}$, and a doping profile depth of the first heavily doped region 204' may be in a range from about 0.01 μm to about 0.1 μm. In some of the embodiments, the first deep well 203' is formed prior to forming the first heavily doped region 204'. However, in some alternative cases, the first deep well 203' can also be formed after forming the first heavily doped region 204'.

A guard ring 221' is formed in the absorption layer 201 by doping the dopant having second conductivity type (in the case of second conductivity type being N type, the dopant may be phosphorus, arsenic, or the like). In some embodiments, a concentration of dopant in the guard ring 221' may be in a range from about 1e15 $cm^{-3}$ to about 1e17 $cm^{-3}$, and a doping profile depth of the guard ring 221' is in a range from about 0.1 μm to about 1 μm.

A second deep well 211' is formed at a position laterally surrounded by the guard ring 221' and above the third deep well 214'. In some embodiments, a top of the second deep well 211 is substantially leveled with a top of the guard ring 221, but the present disclosure is not limited thereto. In some embodiments, the second deep well 211 is doped with dopant having first conductivity type (in the case of first conductivity type being P type, the dopant may be boron, or the like). In some embodiments, a concentration of dopant in the second deep well 211 may be in a range from about 1e15 $cm^{-3}$ to about 1e18 $cm^{-3}$, and a doping profile depth of the second deep well 211 is in a range from about 0.1 μm to about 1 μm.

A well region 212' is formed above the second deep well 211' and the guard ring 221'. In some embodiments, a width W9 of the well region 212' is greater than a width W8 of the second deep well 211'. The well region 212' is doped with dopant having second conductivity type (in the case of second conductivity type being N type, the dopant may be phosphorus, arsenic, or the like). In some embodiments, a concentration of dopant in the well region 212' may be in a range from about 1e15 $cm^{-3}$ to about 1e18 $cm^{-3}$, and a doping profile depth of the well region 212' is in a range from about 0.01 μm to about 1 μm.

A second heavily doped region 213' is formed at a position proximal to the signal transmitting surface TS of the absorption layer 201 (or proximal to a bottom surface of the silicon capping layer 221C), and laterally surrounded by a portion of the well region 212'. In some embodiments, the second heavily doped region 213' is doped with dopant having second conductivity type different from the first conductivity type. For example, the second conductivity type may be N type, and the dopant may be phosphorus, arsenic, or the like. In some embodiments, a concentration of dopant in the second heavily doped region 213' may be in a range from about 1e18 $cm^{-3}$ to about 1e21 $cm^{-3}$, and a doping profile depth of the second heavily doped region 213' is in a range from about 0.01 µm to about 0.1 µm. A depth of the second heavily doped region 213' is less than a depth of the well region 212'.

In some embodiments, the formation may be in the sequence of third deep well 214' at first, followed by the guard ring 221', the second deep well 211', the well region 212', and the second heavily doped region 213'. However, it should be noted that one can adjust the sequence of forming these regions based on specific requirement. Subsequent to forming the third deep well 214', the guard ring 221', the second deep well 211', the well region 212', and the second heavily doped region 213', a second rapid annealing operation is performed to activate the aforementioned regions. A temperature of the second rapid annealing operation is less than the temperature in the first rapid annealing operation. In some embodiments, a temperature of the second rapid annealing operation is in a range from about 750° C. to about 850° C.

Similar to the discussion in FIG. 4K, the sacrificial layer 193 is removed and the protection film 222 is formed over the silicon capping layer 221C and the first surface FS of the substrate 104. In some embodiments, the protection film 222 may include oxide, or other suitable insulating material. An insulation layer 105 is formed over the protection film 222 and the substrate 104. The interconnect structure 230 including a plurality of conductive vias 231 and metal lines 232 are formed in the insulation layer 105 (the details of the interconnect structure 230 can be referred to FIG. 8A to FIG. 8B).

Similar to previous discussion, although the first conductivity type being P type and the second conductivity type being N type is used as an example in FIG. 8A to FIG. 10D, it should be noted that first conductivity type can be N type and the second conductivity type can be P type in the image sensor device 1', which can be utilized as hole sensing device instead.

The present disclosure provides structures and methods of image sensors (especially single photon avalanche diode (SPAD) image sensor) that enhance the sensitivity of responding to radiation at NIR wavelengths and/or radiation around or greater than 1.55 µm. Specifically, by forming a second material (such as germanium) in a cavity of a substrate 104, the issue of lattice mismatch or dislocation defects may be alleviated comparing to a comparative embodiment of forming germanium over a flat silicon surface. Photon detection efficiency may be improved and the operation voltage may be lowered (for example to an extent less than 10V).

The embodiment(s) discussed in FIG. 2A to FIG. 4K provides an approach of forming a multiplication zone 210 proximal to a signal transmitting surface TS of an absorption layer 201. The electrons generated in the absorption layer 201 and subsequently transferred to the interconnect structure 230 through the signal transmitting surface TS of the absorption layer 201.

The embodiment(s) discussed in FIG. 5A to FIG. 7K further provides an approach of forming a multiplication zone 300M in a substrate 104. The multiplication zone 300M may be under and proximal to a bottom of the absorption layer 301, and the electrons generated based on absorbed photon can be guided by a second deep well 310 and transferred to the signal transmitting dopant region 310P which laterally surrounds the absorption layer 301, and further transferred to the interconnect structure 340. By separating the absorption region and multiplication region, the jitter performance may be improved.

The embodiment(s) discussed in FIG. 8A to FIG. 10D further provides an approach of forming implantation areas in the absorption layer 201, for example, forming a multiplication zone 210' (including the second deep well 211', the well region 212', and the second heavily doped region 213'), a guard ring 221', a third deep well 214', and a first heavily doped region 204' and a first deep well 203' in the absorption layer 201. The multiplication effect, avalanche effect and the transferring of generated electrons toward a via 231 of the interconnect structure 230 (through the third deep well 214', the first heavily doped region 204' and the first deep well 203') occur within the absorption layer 201. With this approach, in an example of substrate 104 includes first material (such as silicon) and the absorption layer 201 includes second material (such as germanium), the electrical path is free from crossing over heterojunction, for example, the electrical path is routed in the absorption layer 201 (e.g., the germanium layer) and thus avoiding the dislocation at the heterojunction.

The techniques discussed above can be utilized in various applications such as digital still camera (DSC), mobile phone camera, digital video (DV), digital video recorder (DVR), optical sensor (such as proximity sensor, ambient light sensor heart rate sensor), and optical sensing element (optical transceiver) applications. Such approaches may be compatible to CMOS image sensor (CIS) fabrication operation.

Some embodiments of the present disclosure provide a semiconductor structure, including a substrate including a first material, wherein the first material generates electrical signals from radiation within a first range of wavelengths, an image sensor element including a second material, wherein the second material generates electrical signals from radiation within a second range of wavelengths, the second range is different from first range, a transparent layer proximal to a light receiving surface of the image sensor element, wherein the transparent layer is transparent to radiation within the second range of wavelength, and an interconnect structure connected to a signal transmitting surface of the image sensor element.

Some embodiments of the present disclosure provide a semiconductor structure, including a substrate including a first material, wherein the first material generates electrical signals from radiation within a first range of wavelengths, an image sensor element including a second material, wherein the second material generates electrical signals from radiation within a second range of wavelengths, the second range is different from first range, and a guard ring region proximal to the image sensor element and facing a light-receiving surface of the substrate.

Some embodiments of the present disclosure provide a method for fabricating a semiconductor structure, including forming a first heavily doped region in a semiconductor substrate, forming a cavity from a top surface of the semiconductor substrate, the cavity being surrounded by the first heavily doped region from a top view perspective, and forming a germanium layer in the cavity.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A semiconductor structure, comprising:
   a substrate comprising a first material, wherein the first material generates electrical signals from radiation within a first range of wavelengths;
   an image sensor element comprising a second material, wherein the second material generates electrical signals from radiation within a second range of wavelengths, the second range is different from first range;
   a first heavily doped region laterally surrounding the image sensor element;
   a transparent layer proximal to a light receiving surface of the image sensor element, wherein the transparent layer is transparent to radiation within the second range of wavelength; and
   an interconnect structure connected to a signal transmitting surface of the image sensor element.

2. The semiconductor structure of claim 1, wherein the first heavily doped region is embedded in the second material.

3. The semiconductor structure of claim 1, wherein the substrate further comprises a multiplication zone below the image sensing element.

4. The semiconductor structure of claim 3, wherein the multiplication zone comprises:
   a first implant region having a first conductivity type; and
   a second implant region having a second conductivity type different from the first conductivity type, wherein the second implant region is below the first implant region.

5. The semiconductor structure of claim 4, wherein the second implant region constitute a conductive path connected from the first implant region to the first heavily doped region.

6. The semiconductor structure of claim 1, wherein the first heavily doped region comprises an upper portion with a first dopant concentration and a lower portion with a second dopant concentration, the first dopant concentration is greater than the second dopant concentration.

7. The semiconductor structure of claim 1, wherein the image sensor element further comprises a multiplication zone proximal to the signal transmitting surface.

8. The semiconductor structure of claim 7, wherein the multiplication zone comprises:
   a first implant region having a first conductivity type; and
   a second implant region having a second conductivity type different from the first conductivity type, wherein the second implant region is below the first implant region.

9. The semiconductor structure of claim 1, wherein a concentration of dopant in the first heavily doped region is in a range from about $1 \times 10^{18}$ cm$^{-3}$ to about $1 \times 10^{21}$ cm$^{-3}$.

10. A semiconductor structure, comprising:
    a substrate comprising a first material, wherein the first material generates electrical signals from radiation within a first range of wavelengths;
    an image sensor element comprising a second material, wherein the second material generates electrical signals from radiation within a second range of wavelengths, the second range is different from first range; and
    a guard ring region proximal to the image sensor element and facing a light-receiving surface of the substrate.

11. The semiconductor structure of claim 10, wherein the guard ring is below a bottom surface of the image sensor element.

12. The semiconductor structure of claim 10, further comprising a first heavily doped region laterally surrounding the image sensor element.

13. The semiconductor structure of claim 12, further comprising:
    a first implant region having a first conductivity type, wherein the first implant region is laterally surrounded by the guard ring; and
    a second implant region having a second conductivity type different from the first conductivity type, wherein the second implant region is below the first implant region.

14. The semiconductor structure of claim 10, further comprising:
    a first implant region having a first conductivity type; and
    a second implant region having a second conductivity type different from the first conductivity type, wherein the second implant region is laterally surrounded by the guard ring.

15. A semiconductor structure, comprising:
    a substrate comprising a first material, wherein the first material generates electrical signals from radiation within a first range of wavelengths;
    an image sensor element comprising a second material, wherein the image sensor element is disposed in a recessed portion of the substrate, and the second material generates electrical signals from radiation within a second range of wavelengths, the second range is different from first range;
    a transparent layer proximal to a light receiving surface of the image sensor element, wherein the transparent layer is transparent to radiation within the second range of wavelength; and
    a plurality of microstructure portions at an interface between the substrate and the transparent layer.

16. The semiconductor structure of claim 15, further comprising an interconnect structure connected to a signal transmitting surface of the image sensor element.

17. The semiconductor structure of claim 15, further comprising a silicon capping layer over the image sensor element.

18. The semiconductor structure of claim 17, further comprising an oxide film over the silicon capping layer and the image sensor element.

19. The semiconductor structure of claim 15, further comprising a guard ring overlapping with the image sensor element, wherein the guard ring is doped with an N-type dopant.

20. The semiconductor structure of claim 15, further comprising a shielding layer disposed in the transparent layer.

\* \* \* \* \*